(12) United States Patent
Huang et al.

(10) Patent No.: US 8,093,940 B2
(45) Date of Patent: Jan. 10, 2012

(54) SYSTEM AND METHOD OF TRANSISTOR SWITCH BIASING IN A HIGH POWER SEMICONDUCTOR SWITCH

(75) Inventors: Chun-Wen Paul Huang, Methuen, MA (US); Mark Doherty, Westford, MA (US); Philip Michael Antognetti, Woburn, MA (US)

(73) Assignee: SiGe Semiconductor Inc., Ottawa (CA)

( * ) Notice: Subject to any disclaimer, the term of this patent is extended or adjusted under 35 U.S.C. 154(b) by 84 days.

(21) Appl. No.: 12/761,639

(22) Filed: Apr. 16, 2010

(65) Prior Publication Data

US 2011/0254614 A1 Oct. 20, 2011

(51) Int. Cl.
*H03K 17/687* (2006.01)
(52) U.S. Cl. ......... 327/430; 327/427; 333/103
(58) Field of Classification Search .......... 327/427, 327/430; 333/101–103
See application file for complete search history.

(56) References Cited

U.S. PATENT DOCUMENTS

| 7,123,898 | B2 | 10/2006 | Burgener et al. | |
|---|---|---|---|---|
| 7,173,471 | B2 * | 2/2007 | Nakatsuka et al. | 327/308 |
| 7,345,521 | B2 * | 3/2008 | Takahashi et al. | 327/308 |
| 7,915,946 | B2 * | 3/2011 | Takahashi et al. | 327/427 |
| 2007/0139094 | A1 * | 6/2007 | Nakatsuka et al. | 327/430 |

OTHER PUBLICATIONS

F.J. Huang et al., "A 900-MHz T/R Switch with a 0.8-dB Insertion Loss Implemented in a 0.5-μm CMOS Process", IEEE 2000 Custom Integrated Circuits Conference, pp. 341-344, Gainsville, Florida, U.S.A.
T. Ohnakado et al., "21.5dBm Power-Handling 5GHz Transmit/Receive CMOS Switch Realized by Voltage Division Effect of Stacked Transistor Configuration with Depletion-Layer-Extended Transistors (DETs)", 2003 Symposium on VLSI Circuits Digest of Technical Repairs, pp. 25-28, Kamakura, Kanagawa, Japan.

* cited by examiner

*Primary Examiner* — Quan Tra
(74) *Attorney, Agent, or Firm* — Morris & Kamlay LLP

(57) ABSTRACT

A system and method are provided for biasing transistor switches in a semiconductor based high power switch. Off-state Vgsd biasing for the off transistor switches is based upon acceptable levels of spurious harmonic emissions and linearity.

29 Claims, 13 Drawing Sheets

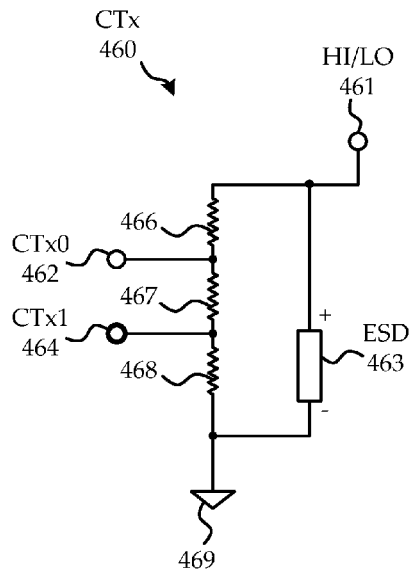
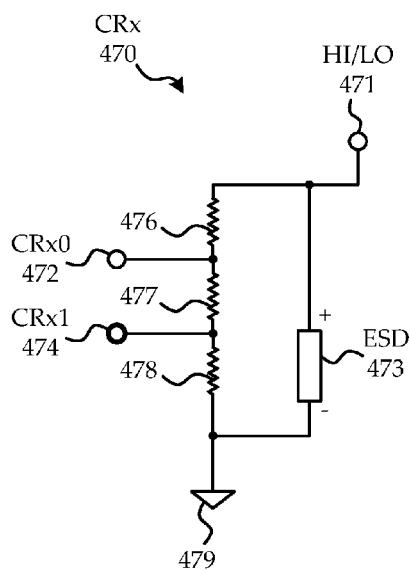
FIG. 4A
FIG. 4B
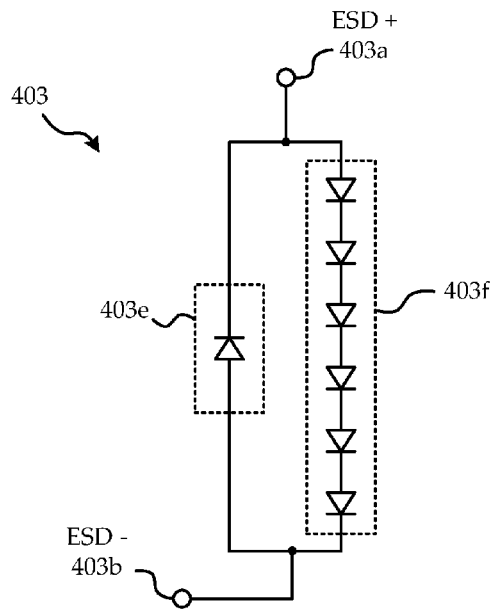
FIG. 4C

SYSTEM AND METHOD OF TRANSISTOR SWITCH BIASING IN A HIGH POWER SEMICONDUCTOR SWITCH

FIELD OF THE INVENTION

The invention relates to high power semiconductor switches, and more particularly to FET switch layouts and biasing thereof.

BACKGROUND OF THE INVENTION

In modern RF communication systems a semiconductor-based transmit-receive switch is often the last/first component encountered by a transmitted/received signal before/after encountering an antenna. Figures of merit for signal quality of such a transmit-receive switch are switch linearity and spurious harmonic emission levels.

Many of the main advances in semiconductor-based transmit-receive switches have been with respect to isolation and insertion loss. Groups of FETs are arranged in the switch along with judiciously chosen resistors and capacitors to ensure low insertion loss along the signal path and high isolation from the off paths. One general approach utilizes, instead of a single FET switch along each alternative path, a group of FET switches in series. This general approach moreover does not simply turn the FETs on and off by utilizing only a voltage at the gate, but instead biases both the gate and the source/drain in a forward and reverse manner to turn the FETs full-on and full-off respectively.

An example of such a prior art approach, explained in Nakatsuka et al. (U.S. Pat. No. 7,199,635) is presented in FIG. 1A. A single pole double throw (SPDT) switch 100 is shown. One input/output pole terminal 101 (referred to as the pole) is coupled through a first FET group switch 120 to a first input/output terminal 102, and is connected through a second FET group switch 130 to a second input/output terminal 103. Each FET group switch 120, 130 has a group of FET transistors (for example the group of FET transistors 122 in the first FET group switch 120) connected in series with the signal path from the pole 101 to the corresponding first or second input/output terminal 102, 103. Each FET group switch 120, 130 also includes a group of source/drain resistors (for example source/drain resistors 124) coupled to the sources and/or drains of the FETs of the group switch, and coupled to one of a first and second biasing terminal 111, 112. Each FET group switch also includes a group of gate resistors (for example gate resistors 126 of FET group switch 120) coupled to the gates of the FETs of the group switch and to the other one of the first and second bias terminals 111, 112.

Some early work on T/R Switches based on CMOS is described in: Feng-Jung Huang, Kenneth O, A 900-MHz T/R Switch with a 0.8-dB Insertion Loss Implemented in a 0.5-um CMOS Process, IEEE 2000 Custom Integrated Circuits Conference; Takahiro Ohnakado et al, 21.5 dBm Power-Handling 5 GHz Transmit/Receive CMOS Switch Realized by Voltage Division Effect of Stacked Transistor Configuration with Depletion-Layer-Extended Transistor (DETs), 2003 Symposium on VLSI Circuits Digest of Technical Papers; and F.-J Huang and K. O., A 0.5 umCMOS T/R Switch for 900 MHz wireless applications, IEEE J. Solid-State Circuits, Vol. 36, pp. 486-492, March 2001.

The gates of the first FET group switch 120 and the source/drains of the second FET group switch 130 are biased by the first biasing terminal 111, while the gates of the second FET group switch 130 and the source/drains of the second FET group switch 130 are biased by the second biasing terminal 112.

To connect the pole 101 to the first input/output terminal 102, the first biasing terminal 111 is set to $V_{HI}$ (a high-level voltage), while the second biasing terminal 112 is set to $V_{LO}$ (a low-level voltage), such that the FETs of the first FET group switch 120 are fully on and the FETs of the second FET group switch 130 are biased with reverse polarity and hence fully off, within the reliability/breakdown limits of operation. To connect the pole 101 to the second input/output terminal 103, the second biasing terminal 112 is set to $V_{HI}$, while the first biasing terminal 111 is set to $V_{LO}$, such that the FETs of the second FET group switch 130 are fully on and the FETs of the first FET group switch 120 are biased with reverse polarity and hence fully off, within the reliability/breakdown limits of operation.

This configuration fully biases each FET group switch with an on or off polarity ensuring respectively low insertion loss and high isolation which are very important when dealing with high-power signal transmission. It can be seen from the circuit design that the bias applied to each FET group switch differs only in polarity. For further clarity, it should be understood that whenever a BJT, FET, MOSFET, MUGFET, FET group switch, or any other transistor switch is said to be biased with, or applied with biasing of, an "on polarity" or "forward polarity", the voltages applied to the gate and the source/drains are such that the respective transistor switch is in an "on state". It also should be understood that conversely, whenever a transistor switch is said to be biased with or having applied thereto biasing of an "off polarity" or "reverse polarity", the voltage applied to the gate and source/drains are of a polarity reverse from that which would be applied to the gate and source/drains to put the transistor in an "on state". This is to be distinguished from a biasing which achieves an "off state" in the transistor but which is of the same polarity as that (albeit much smaller in magnitude) which achieves the "on state", or a biasing of zero which may achieve the "off state" but which has no polarity.

An example of a second prior art approach according to Nakatsuka et al. (U.S. Pat. No. 7,199,635) is depicted in FIG. 1B. A single pole double throw switch 150 including series and shunt FETs a shown. One input/output pole terminal 151 is coupled through a first FET group switch 160 to a first input/output terminal 152, and is connected through a second FET group switch 170 to a second input/output terminal 153. At a junction between the first input/output terminal 152 and the first FET group switch 160 is a connection coupled through a third FET group switch 180 and a blocking capacitor 182, to ground 184. At a junction between the second input/output terminal 153 and the second FET group switch 170 is a connection coupled through a fourth FET group switch 190, and a blocking capacitor 192 to ground 194. Each of the FETs of the first FET group switch 160 is connected in series between the first input/output terminal 152 and the pole 151 while each of the FETs of the second FET group switch 170 is connected in series between the second input/output terminal 153 and the pole 151. Since each of the first and second FET group switches 160, 170 are coupled between the pole and an input/output terminal, they are referred to as the series FET group switches. Each of the FETs in the third FET group switch 180 is connected in series between the first input/output terminal 152 and ground 184, while each of the FETs in the fourth FET group switch 190 is connected in series between the second input/output terminal 153 and ground 194. Since each of the third and fourth FET group switches 180, 190 coupled between an input/output terminal and ground, they are referred to as shunt FET group switches.

A first biasing terminal 154 is coupled to the gates of the first and fourth FET group switches 160, 190 and the source/drains of the second and third FET group switches 170, 180. A second biasing terminal 155 is coupled to the Gates of the second and third FET group switches 170, 180 and the source/drains of the first and fourth FET group switches 160, 190.

When the first biasing terminal 154 is $V_{HI}$ and the second biasing terminal 155 is $V_{LO}$, the first and fourth FET group switches 160, 190 are biased to full on while the second and third group switches 170, 180 are biased with reverse polarity to full off. Consequently, the pole 151 is strongly coupled with the first input/output terminal 152 while being strongly isolated from the second input/output terminal 153, the first input/output terminal 152 is strongly isolated from ground 184 while the second input/output terminal 153 is strongly coupled, or shunted, to ground 194.

Conversely, when the first biasing terminal 154 is $V_{LO}$ and the second biasing terminal 155 is $V_{HI}$, the second and third FET group switches 170, 180 have a strong inversion layer such that they are fully on while the first and fourth group switches 160, 190 are biased with a reverse polarity and are fully off. Consequently, the pole 151 is strongly coupled with the second input/output terminal 153 while being strongly isolated from the first input/output terminal 152, the first input/output terminal 152 is strongly coupled, or shunted, to ground 184 while the second input/output terminal 153 is strongly isolated from ground 194.

The prior art single pole double throw switch depicted in FIG. 1B achieves higher isolation than the prior art single pole double throw switch depicted in FIG. 1A by strongly coupling the input/output terminal which is not in use to ground.

Although the prior art approaches have achieved high isolation and low insertion loss many other performance factors and considerations for the transmit-receive switch have not been adequately addressed thereby.

SUMMARY OF THE INVENTION

According to one aspect, the invention provides for a method of biasing transistor switches in a high power switch, the method comprising: providing on polarity gate to source/drain bias (on-state Vgsd) such that a strong inversion layer (channel) is created at an on-state Vgsd level to a first transistor switch of said transistor switches for biasing the first transistor switch in an on state; and providing off polarity Vgsd (off-state Vgsd) such that no channel is established at a off polarity Vgsd level to a second transistor switch of said transistor switches for biasing the second transistor switch in an off state, wherein the magnitude of the off-state Vgsd level is less than a magnitude of the on-state Vgsd level by only an amount sufficient for at least one of: bringing spurious harmonic emissions of said second transistor switch when biased to the off state below a pre-identified upper limit of acceptable spurious harmonic emissions from the second transistor switch in the off state; and bringing a linearity of the high power switch above a pre-identified lower limit of acceptable linearity for the high power switch.

According to another aspect the invention provides for a method of biasing transistor switches in a high power switch, the method comprising: biasing at a gate of a first transistor switch of the transistor switches with a first biasing controller at a fixed primary biasing fraction of a first control voltage input to the first biasing controller; biasing at a source-drain of the first transistor switch with a second biasing controller at a fixed secondary biasing fraction of a second control voltage input to the second biasing controller; biasing at a gate of a second transistor switch of the transistor switches with the second biasing controller at the fixed primary biasing fraction of the second control voltage input; and biasing at a source-drain of the second transistor switch with the first biasing controller at the fixed secondary biasing fraction of the first control voltage; wherein when the high power switch is in a first switch state in which the first transistor switch is on and the second transistor switch is off: providing a high system control voltage as the first control voltage to the first biasing controller; and providing a low system control voltage as the second control voltage to the second biasing controller, wherein when the high power switch is in a second switch state in which the first transistor switch is off and the second transistor switch is on: providing a low system control voltage as the first control voltage to the first biasing controller; and providing a high system control voltage as the second control voltage to the second biasing controller, wherein: a magnitude of the difference between the product of the primary biasing fraction and the low system control voltage and the product of the secondary biasing fraction and the high system control voltage is less than a magnitude of the difference between the product of the primary biasing fraction and the high system control voltage and the product of the secondary biasing fraction and the low system control voltage by only an amount sufficient for at least one of: bringing spurious harmonic emissions of said second transistor switch when biased to the off state below a pre-identified upper limit of acceptable spurious harmonic emissions from the second transistor switch in the off state; and bringing a linearity of the high power switch above a pre-identified lower limit of acceptable linearity for the high power switch.

According to another aspect the invention provides for a high power switch comprising: a plurality of transistor switches comprising: a first transistor switch; and a second transistor switch, biasing circuitry for providing, when the high power switch is in a first high power switch state: on-state Vgsd at a on-state Vgsd level to the first transistor switch for biasing the first transistor switch in an on state; and biasing at an off-state Vgsd level to the second transistor switch for biasing the second transistor switch in an off state, wherein the magnitude of the off-state Vgsd level is less than a magnitude of the on-state Vgsd level by only an amount sufficient for at least one of: bringing spurious harmonic emissions of said second transistor switch when biased to the off state below a pre-identified upper limit of acceptable spurious harmonic emissions from the second transistor switch in the off state; and bringing a linearity of the high power switch above a pre-identified lower limit of acceptable linearity for the high power switch.

According to another aspect the invention provides for a high power switch comprising: a first transistor switch; a second transistor switch; a first biasing controller for receiving a first control voltage and for: biasing at a gate of the first transistor switch at a fixed primary biasing fraction of the first control voltage; and biasing at a source-drain of the second transistor switch at a fixed secondary biasing fraction of the first control voltage, a second biasing controller for receiving a second control voltage and for: biasing at a source-drain of the first transistor switch at the fixed secondary biasing fraction of the second control voltage; and biasing at a gate of the second transistor switch at the fixed primary biasing fraction of the second control voltage input, wherein the first control voltage and the second control voltage are each a different one of a high system control voltage and a low system control voltage, and wherein: a magnitude of the difference between the product of the primary biasing fraction and the low system control voltage and the product of the secondary biasing fraction and the high system control voltage is less than a magnitude of the difference between the product of the primary biasing fraction and the high system control voltage and the product of the secondary biasing fraction and the low system control voltage by only an amount sufficient for at least one of: bringing spurious harmonic emissions of said second transistor switch when biased to the off state below a pre-identified upper limit of acceptable spurious harmonic emissions from the second transistor switch in the off state; and bringing a linearity of the high power switch above a pre-identified lower limit of acceptable linearity for the high power switch.

BRIEF DESCRIPTION OF THE DRAWINGS

The features and advantages of the invention will become more apparent from the following detailed description of the preferred embodiment(s) with reference to the attached figures, wherein:

FIG. 4A is a circuit diagram illustrating a transmit bias controller;

FIG. 4B is a circuit diagram illustrating a receive bias controller;

FIG. 4C is a circuit diagram illustrating the electrostatic discharge prevention device of FIGS. 4A and 4B;

Figure 1A:
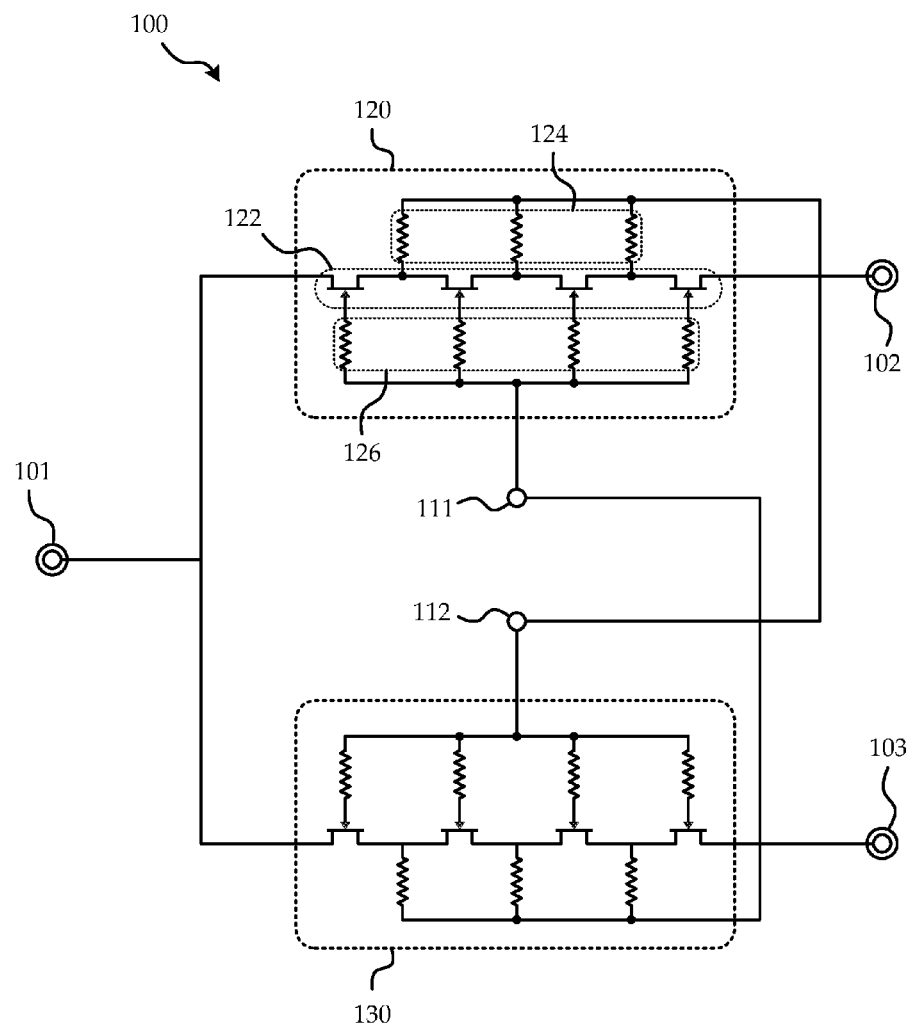
FIG. 1A is a circuit diagram illustrating a prior art implementation of a SPDT switching circuit.
Figure 1B:
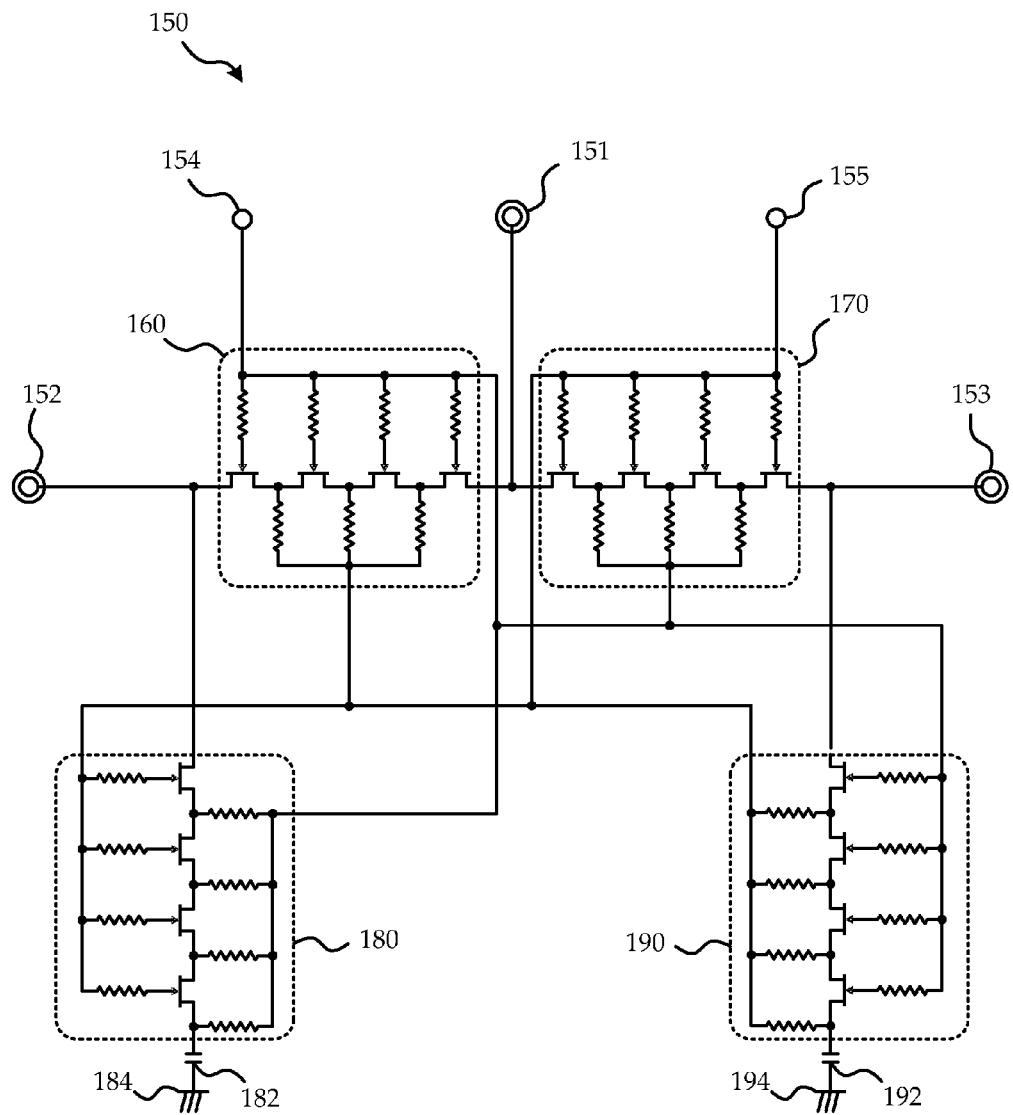
FIG. 1B is a is a circuit diagram illustrating a second prior art implementation of a SPDT switching circuit.

It is noted that in the attached figures, like features bear similar labels.

DETAILED DESCRIPTION OF THE PREFERRED EMBODIMENTS

While maximizing the on-state Vgsd for the on-state FET group switches and fully maximizing the off-state Vgsd of the off-state FET group switches achieves respectively low insertion loss and high isolation where and as needed, a quality of the signals passing through the transmit-receive switch depends upon, amongst other things, the particular voltages chosen for off-state Vgsd and on-state Vgsd of the FETs within the switch.

The inventors have found in the implementation of a high power transmit-receive switch using silicon on insulator (SOI) which has a breakdown voltage lower than the switch control voltage level and utilizing a single or a series of connected MOSFETs and/or MultiGate FETs (MUGFETs), that improved signal quality is obtained from biasing the FETs at a level other than at the largest possible bias within the reliability/breakdown limits of operation.

The inventors have observed that applying off-state Vgsd to the off-state FET group switches beyond a certain voltage level has very little effect on the isolation obtained therefrom and hence little advantage is gained from maximizing the off-state Vgsd of the off-state FET group switches to the same level that the on-state FET group switches are biased, except perhaps for simplicity of design. The inventors have also observed that at relatively high signal strengths, spurious harmonic emissions were emanating from the off-state FET group switches and nonlinear effects in the switching circuit resulted.

The spurious third harmonic emissions has a more steep slope versus power drive than that of the spurious second harmonic emissions, but both kinds of spurious harmonic emissions increase with increasing off-state Vgsd beyond a certain bias voltage. Nonlinear effects in the high power switch were also found to increase with increasing off-state Vgsd of the off-state FET group switches. For a 2.5 V SOI, low levels of harmonic emissions and sufficient linearity, were found at off-state Vgsd of 1.5 V and less where the channel linking the source and drain is not in strong inversion. Considering the need for isolation, the operating off-state Vgsd level for the turned off FET group switches is chosen to be 1.1 V-1.5 V. In general, the off-state Vgsd level should be determined after an acceptable upper limit to the spurious harmonic emissions and an acceptable lower limit of linearity have been identified. Such identification will of course depend upon the application in which the switch is to be used. The identification of these limits allows reduction of the magnitude of the off-state Vgsd by only the amount required to meet the spurious harmonic and linearity requirements, and hence keeping as much of the benefits of higher isolation that large off-state Vgsd provides in comparison with off-states achieved by zero biasing or very small biasing of an on polarity. Higher isolation is achieved by using a significant off-state Vgsd level, since the off-state switch is then able to isolate larger amplitude signals to a greater degree than switches applied with a small or insignificant off-state Vgsd.

For the on-state FET group switches, lower harmonic emissions were found above a voltage level close to the gate to source breakdown voltage. With the 2.5V SOI technology, 2.0-2.5 V of on-state Vgsd was found to exhibit a very low insertion loss, and good linearity. Considering the reliability constraint of 2.5 V, the operating on-state Vgsd level for the turned on FET group switches is chosen to be 2.0 V-2.5 V.

Figure 2:
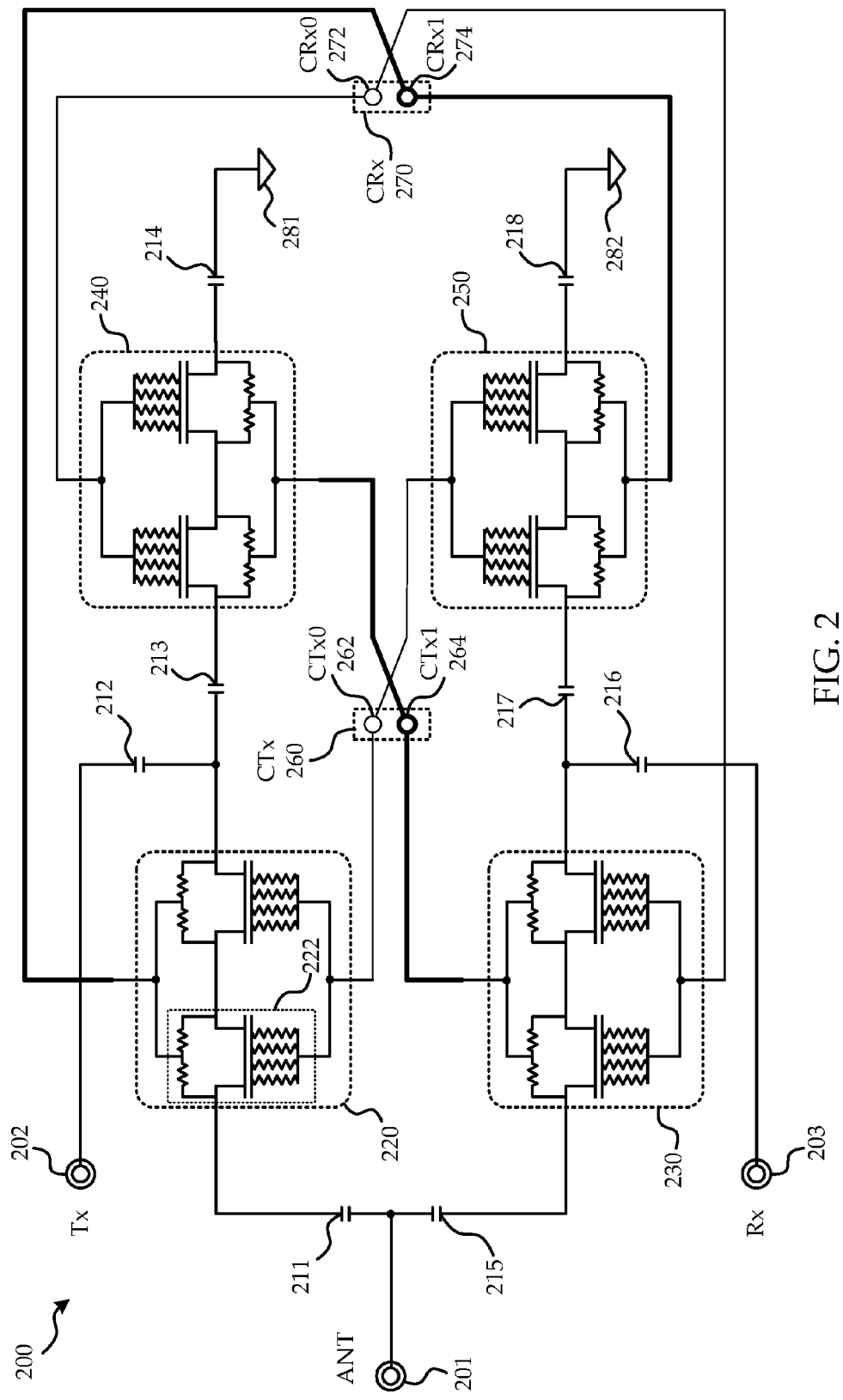
FIG. 2 is a circuit diagram illustrating a SPDT switch according to one embodiment of the invention.

Referring to FIG. 2, a single pole dual throw (SPDT) transmit-receive switch 200 in accordance with a first embodiment of the invention will now be discussed in terms of its structure.

The SPDT switch 200 comprises an antenna 201, a transmit terminal 202, a receive terminal 203, a transmit branch ground connection 281, and a receive branch ground connection 282. Along a signal path from the antenna 201 to the transmit terminal 202, the antenna 201 is coupled to a blocking capacitor 211 coupled in series with a first series FET group switch 220 and another blocking capacitor 212. Along a signal path from the antenna 201 to the receive terminal 203, the antenna 201 is coupled to a blocking capacitor 215 and coupled in series with a second series FET group switch 230 and another blocking capacitor 216. Along a shunt path from the transmit terminal 202 to the transmit branch ground connection 281, the transmit terminal 202 is coupled to the blocking capacitor 212, a blocking capacitor 213 in series with a first shunt FET group switch 240 and another blocking capacitor 214. Along a shunt path from the receive terminal 203 to the receive branch ground connection 282, the receive terminal 203 is coupled to the blocking capacitor 216, a blocking capacitor 217 in series with a second shunt FET group switch 250 and another blocking capacitor 218. Each of the series and shunt FET group switches 220, 230, 240, 250 comprises two MUGFETs connected in series, and which have common gate and bias connections.

Figure 3A:
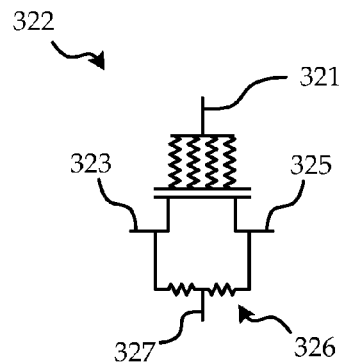
FIG. 3A is a diagram illustrating a multigate FET.
Figure 3B:
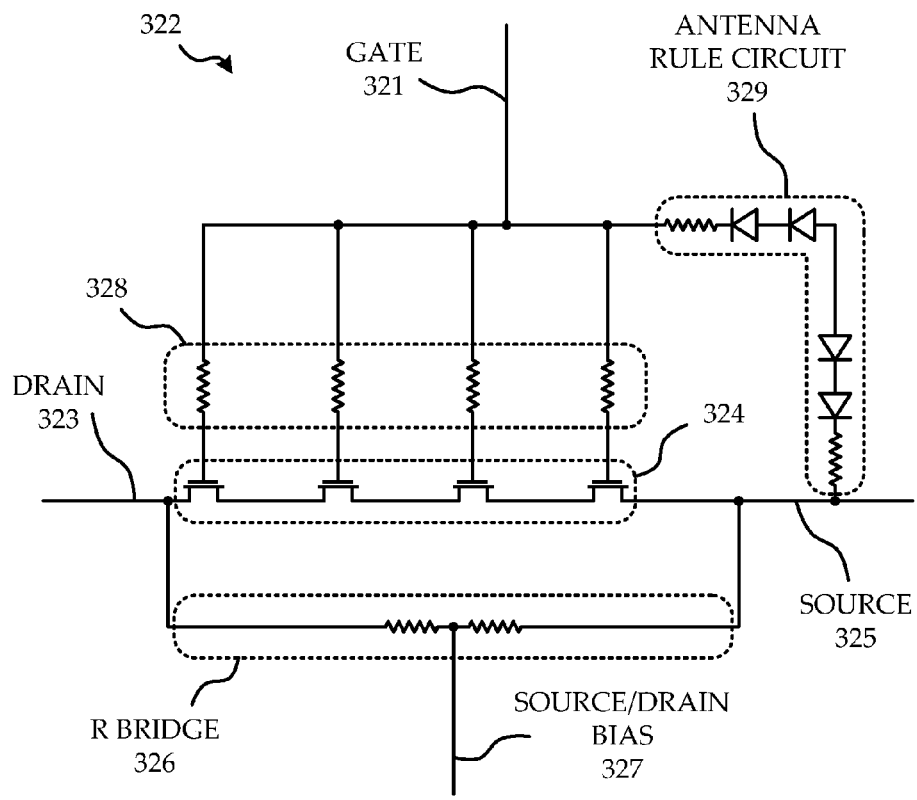
FIG. 3B is a circuit diagram illustrating the multigate FET of FIG. 3A.

Referring now also to FIG. 3A and FIG. 3B, the MUGFETs employed in the embodiments described herein such as MUGFET 222 of FIG. 2 will be described. Each MUGFET 322 comprises a gate 321, a source 323, a drain 325, and a source/drain bias connection 327 connected to an R bridge or tie R 326 which ensures that the DC voltage of the drain 323 and the source 325 are the same. Between the drain 323 and source 325 are a group of MOSFETs (in this case four) 324 connected in series. Connected to each gate of the group of MOSFETs 324 is a resistor from a group of gate resistors 328, each of which is connected to the gate 321. Between the gate 321 and the source 325 is an antenna rule circuit 329 comprising a set of diodes and resistors and is included in order to satisfy the antenna rules required by fabrication.

As with the prior art, the gate and source/drain bias connections of the FET group switches are connected to various biasing terminals which ensure that the appropriate on or off-state Vgsd is applied across each FET group switch at the appropriate time. As discussed hereinabove, the inventors have identified that the chosen on-state Vgsd levels should be 2.0 V-2.5 V while the chosen off-state Vgsd levels should be 1.1 V-1.5 V. To achieve the multiple levels of biasing required in the transmit-receive circuit a special bias controller architecture has been provided. In the SPDT circuit 200 there are two such controllers, a transmit bias controller 260 and a receive bias controller 270.

Referring now also to FIG. 4A, FIG. 4B, and FIG. 4C, the architecture for the transmit and receive bias controllers will now be described. A transmit bias controller 460 is depicted in FIG. 4A. The transmit bias controller 460 is essentially a voltage divider spanning a HI/LO input terminal 461 and ground 469. The HI/LO input terminal 461 is coupled across a first resistor 466 to a primary bias output 462 which in turn is coupled across a second resistor 467 to a secondary bias output 464 which is coupled across a third resistor 468 to ground 469. Coupled between ground 469 and the HI/LO input terminal 461 is an ESD (Electrostatic discharge) prevention circuit 463 for HBM (human body model) of 200 V and above.

An ESD 403 which may be used in a bias controller as illustrated in FIG. 4A and FIG. 4B is depicted in FIG. 4C and comprises a number of diodes arranged in a loop in an opposing fashion. In the ESD 403 along one side of the loop between the positive terminal 403A and the negative terminal 403B are one diode 403E directed towards the positive terminal 403A, while along the other side of the loop between the positive terminal 403A and the negative terminal 403B are six diodes 403F directed towards the negative terminal 403B. The number of diodes in the forward and reverse diode stacks can be reduced or increased based on the turn-on voltage of the diode.

The resistors 466, 467, 468 of the bias controller 460 are chosen such that when the HI/LO input terminal 461 is at $V_{HI}$, the voltage at the primary bias output 462 is at a level which is ideal for on-state Vgsd, while the voltage at the secondary bias output 464 is at a level which is ideal for off-state Vgsd. The ratio between $V_{HI}$ and the voltage at the primary bias output 462 is set by the ratio of the total resistance of all of the resistors 466, 467, 468 to the resistance of the second 467 and the third 468 resistors summed together. The ratio between $V_{HI}$ and the voltage at the secondary bias output 464 is set by the ratio of the total resistance of all the resistors 466, 467, 468 to the resistance of the third resistor 468.

In an embodiment utilized in a traditional WLAN radio, the 3.0-3.6 V switch control lines are utilized for $V_{HI}$, while $V_{LO}$ typically ranges between 0.0 V and 0.3 V. In an embodiment utilizing a $V_{HI}$ of 3.3 V and $V_{LO}$ of 0.15 V, the first resistor can be chosen to be 30 kΩ, the second resistor can be chosen to be 22 kΩ, while the third resistor can be chosen to be 48 kΩ. When the HI/LO input terminal 461 is at $V_{HI}$, the voltage at the primary bias output 462 is 2.31 V while the voltage at the secondary bias output 464 is 1.584 V. When the HI/LO input terminal 461 is at $V_{LO}$, the voltage at the primary bias output 462 is 0.105 V while the voltage at the secondary bias output port 464 is 0.072 V.

A receive bias controller 470 is depicted in FIG. 4B. The receive bias controller 470 has the same structure as the transmit bias controller 460, having an input terminal 471, a first resistor 476, a primary bias output 472, a second resistor 477, a secondary bias output 474, a third resistor 478, a ground connection 479, and an ESD prevention circuit 473. The considerations which determine which resistances are chosen for the first, second, and third resistor 476, 477, 478, are the same as those which were described in association with the transmit bias controller 460. As a consequence, first resistor 476 is chosen to be 30 kΩ, the second resistor is chosen to be 22 kΩ, while the third resistor is chosen to be 48 kΩ.

In some embodiments, a voltage divider providing the appropriate division of $V_{HI}$ and $V_{LO}$ comprises appropriate diode stacks.

Referring once again also to FIG. 2, a primary bias output 262 of the transmit bias controller 260 is coupled to the gate of the first series FET group switch 220 and is also coupled to the gate of the second shunt FET group switch 250, while a secondary bias output 264 of the transmit bias controller 260 is coupled to the source/drain bias connection of the second series FET group switch 230 and is also coupled to the source/drain bias connection of the first shunt FET group switch 240. A primary bias output 272 of the receive bias controller 270 is coupled to the gate of the second series FET group switch 230 and is also coupled to the gate of the first shunt FET group switch 240, while a secondary bias output 274 of the receive bias controller 270 is coupled to the source/drain bias connection of the first series FET group switch 220 and is also coupled to the source/drain bias of the second shunt FET group switch 250.

The SPDT switch 200 of FIG. 2 will now be described in terms of its function.

As with the prior art, in order to ensure low insertion loss and adequate isolation, when the antenna 201 is utilized for transmission, the first series FET group switch 220 and the second shunt FET group switch 250 are provided with on-state Vgsd such that a strong inversion layer creates a low resistance path between source and drain diffusions while the second series FET group switch 230 and the first shunt FET group switch 240 are provided off-state Vgsd wherein no channel is established. In order to reduce spurious harmonic emissions and to improve linearity, on-state Vgsd is chosen to be at a level between 2.0V and 2.5V while off-state Vgsd is chosen to be at a level between 1.1V and 1.5V.

When the SPDT switch 200 is utilized for transmission, $V_{HI}$ is applied to the HI/LO input terminal of the transmit bias controller 260 while $V_{LO}$ is applied to the HI/LO input terminal of the receive bias controller 270. Consequently, the gates of the first series FET group switch 220 and the second shunt FET group switch 250 are held at 2.31 V while the source/drain bias connections of the second series FET group switch 230 and the first shunt FET group switch 240 are held at 1.584 V. Also, the gates of the first shunt FET group switch 240 and the second series FET group switch 230 are held at 0.105 V while the source/drain bias connections of the first series FET group switch 220 and the second shunt FET group switch 250 are held at 0.070V. The resulting on-state Vgsd across each of the first series FET group switch 220 and the second shunt FET group switch 250 is 2.24 V, while the resulting off-state Vgsd across each of the second series FET group switch 230 and the first shunt FET group switch 240 is 1.479 V.

Conversely, when the SPDT switch 200 is utilized for reception, $V_{LO}$ is applied to the HI/LO input terminal of the transmit bias controller 260 while $V_{HI}$ is applied to the HI/LO input terminal of the receive bias controller 270. The result is an on-state Vgsd of 2.24 V applied across each of the second series FET group switch 230 and the first shunt FET group switch 240, along with an off-state Vgsd of 1.479 V applied across each of the first series FET group switch 220 and the second shunt FET group switch 250.

During normal operation for which only one of transmission or reception is used, one of the transmit bias controller 260 and the receive bias controller 270 is input with $V_{HI}$ while the other is input with $V_{LO}$. As described above, this ensures that proper biasing of the FET group switches 220, 230, 240, 250 is achieved. For loopback mode, both the transmit bias controller 260 and the receive bias controller 270 are input with $V_{HI}$, causing both shunt FET group switches 240, 250 to turn off and both series FET group switches 220, 230 to turn on.

Figure 5A:
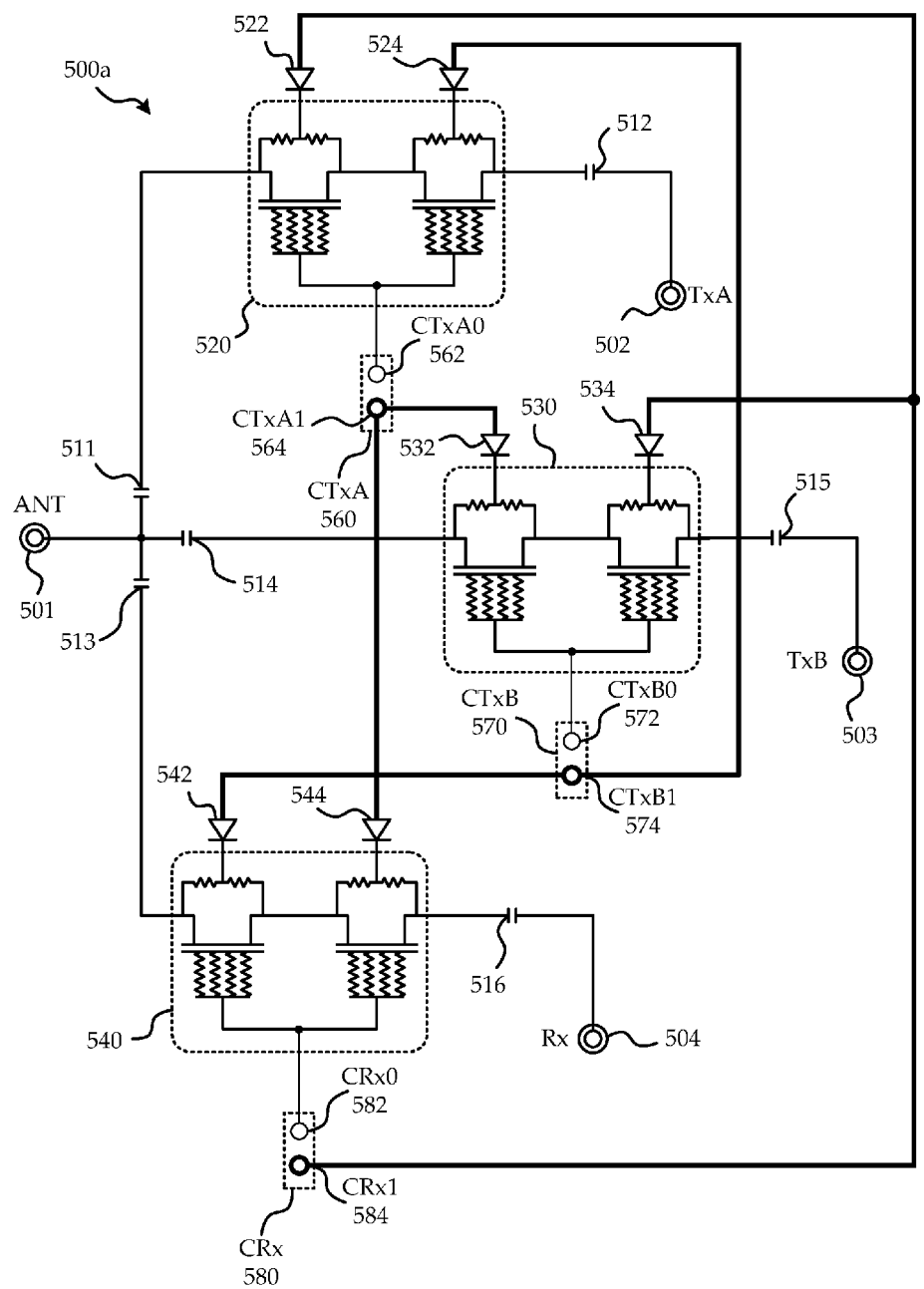
FIG. 5A is a circuit diagram illustrating a single pole triple throw (SP3T) series only switch according to an embodiment of the invention.

Referring now to FIG. 5A, a single pole triple throw (SP3T) series only transmit-receive switch 500a in accordance with an embodiment of the invention will now be discussed in terms of its structure. Unlike the SPDT switch 200, the SP3T switch 500a depicted in FIG. 5A does not have any paths or switches for shunting to ground.

The SP3T switch 500a comprises an antenna 501, a first transmit terminal 502, a second transmit terminal 503, and a receive terminal 504. Along a signal path from the antenna 501 to the first transmit terminal 502, the antenna 501 is coupled to a blocking capacitor 511 coupled in series with a first series FET group switch 520 and another blocking capacitor 512. Along a signal path from the antenna 501 to the second transmit terminal 503, the antenna 501 is coupled to a blocking capacitor 514 and coupled in series with a second series FET group switch 530 and another blocking capacitor 515. Along a signal path from the antenna 501 to the receive terminal 504, the antenna 501 is coupled to a blocking capacitor 513 in series with a third series FET group switch 540 and another blocking capacitor 516. As with the embodiment depicted in FIG. 2, each of the series FET group switches 520, 530, 540 comprises two MUGFETs connected in series, however, although each pair have a common gate, they do not share source/drain bias connections.

As with the embodiment described hereinabove, the gate and source/drain bias connections of the FET group switches are connected to various biasing terminals which ensure that the appropriate on and off-state Vgsd is applied across each FET group switch at the appropriate time. As discussed hereinabove, the inventors have identified that the chosen on-state Vgsd levels should be 2.0 V-2.5 V while the chosen off-state Vgsd levels should be 1.1 V-1.5 V. As with the embodiment described above, bias controllers are used to achieve the multiple levels of biasing required in the transmit-receive switch. In the SP3T switch 500a there are three such controllers, a first transmit bias controller 560, a second transmit bias controller 570, and a receive bias controller 580.

A primary bias output 562 of the first transmit bias controller 560 is coupled to the gate of the first series FET group switch 520, while a secondary bias output 564 of the first transmit bias controller 560 is coupled to an anode of a diode 532, whose cathode is coupled to the source/drain bias connection of one of the MUGFETs of the second series FET group switch 530. The secondary bias output 564 of the first transmit bias controller 560 is also coupled to an anode of a second diode 544, whose cathode is coupled to the source/drain bias connection of one of the MUGFETs of the third series FET group switch 540. A primary bias output 572 of the second transmit bias controller 570 is coupled to the gate of the second series FET group switch 530, while a secondary bias output 574 of the second transmit bias controller 570 is coupled to an anode of a third diode 524, whose cathode is coupled to the source/drain bias connection of one of the MUGFETs of the first series FET group switch 520. The secondary bias output 574 of the second transmit bias controller 570 is also coupled to an anode of the fourth diode 542, whose cathode is coupled to the source/drain bias of one of the MUGFETs of the third series FET group switch 540. A primary bias output 582 of the receive bias controller 580 is coupled to the gate of the third series FET group switch 540, while a secondary bias output 584 of the receive bias controller 580 is coupled to an anode of a fifth diode 522, whose cathode is coupled to the source/drain bias connection of one of the MUGFETs of the first series FET group switch 520. The secondary bias output 584 of the receive bias controller 580 is also coupled to an anode of a sixth diode 534, whose cathode is coupled to the source/drain bias of one of the MUGFETs of the second series FET group switch 530.

Each of the first and second transmit bias controller, and the receive bias controller has the same structure and function as the bias controllers depicted in FIG. 4A and FIG. 4B.

The SP3T switch 500a of FIG. 5A will now be described in terms of its function.

As with the embodiments described above, in order to ensure low insertion loss and adequate isolation, when the antenna 501 is utilized along one of the first and second transmit paths, and the receive path, the corresponding one of the series FET group switches, is provided with an on-state Vgsd bias level while the remaining two series FET group switches are provided with an off-state Vgsd bias level. As described above, in order to reduce spurious harmonic emissions and to improve linearity, on-state Vgsd is chosen to be at a level between 2.0 V and 2.5 V while off-state Vgsd is chosen to be at a level between 1.1 V and 1.5 V.

When the SP3T switch 500a is utilized for transmission from the first transmit terminal 502, $V_{HI}$ is applied to the HI/LO input terminal of the first transmit bias controller 560 while $V_{LO}$ is applied to the HI/LO input terminals of the second transmit bias controller 570 and the receive bias controller 580. Consequently, the gates of the first series FET group switch 520 are held at 2.31 V while one of the source/drain bias connections of the second series FET group switch 530 and one of the source/drain bias connections of the third series FET group switch 540 are held at 1.584 V. The gates of the second series FET group switch 530 and the third series FET group switch 540 are held at 0.105 V while the source/drain bias connections of the first series FET group switch 520 and one of the source/drain bias connections of each of the second and third series FET group switches 530, 540 are held at 0.070 V. The resulting on-state Vgsd across the first series FET group switch 520 is 2.24 V. One MUGFET of each of the second and third series FET group switches 530, 540 is provided an off-state Vgsd level of 1.479 V, while a second MUGFET of each of the second and third series FET group switches 530, 540 is unbiased by way of the respective diodes 534, 542 stopping any leakage current caused by a 0.035V applied across the second MUGFET in a reverse direction to the diode.

When the SP3T switch 500a is utilized for transmission from the second transmit terminal 503, $V_{HI}$ is applied to the HI/LO input terminal of the second transmit bias controller 570 while $V_{LO}$ is applied to the HI/LO input terminals of the first transmit bias controller 560 and the receive bias controller 580. The result is an on-state Vgsd of 2.24 V applied across the second series FET group switch 530, along with an off-state Vgsd of 1.479V applied to one MUGFET and a zero bias applied to the other MUGFET in each of the first series FET group switch 520 and the third series FET group switch 540.

When the SP3T switch 500a is utilized for reception, $V_{HI}$ is applied to the HI/LO input terminal of the receive bias controller 580, while $V_{LO}$ is applied to the HI/LO input terminals of the first and second transmit bias controllers 560, 570. The result is an on-state Vgsd of 2.24 V applied across the third series FET group switch 540, along with an off-state Vgsd of 1.479V applied to one MUGFET and a zero bias applied to the other MUGFET in each of the first series FET group switch 520 and the second series FET group switch 530.

During normal operation for which only one of transmission over the first or second transmit terminal or reception over the receive terminal is used, one of the bias controllers 560, 570, 580 is input with $V_{HI}$ while the other two of the bias controllers is input with $V_{LO}$. As described above this ensures that proper on and off-state Vgsd biasing of the FET group switches 520, 530, 540 is achieved.

Figure 5B:
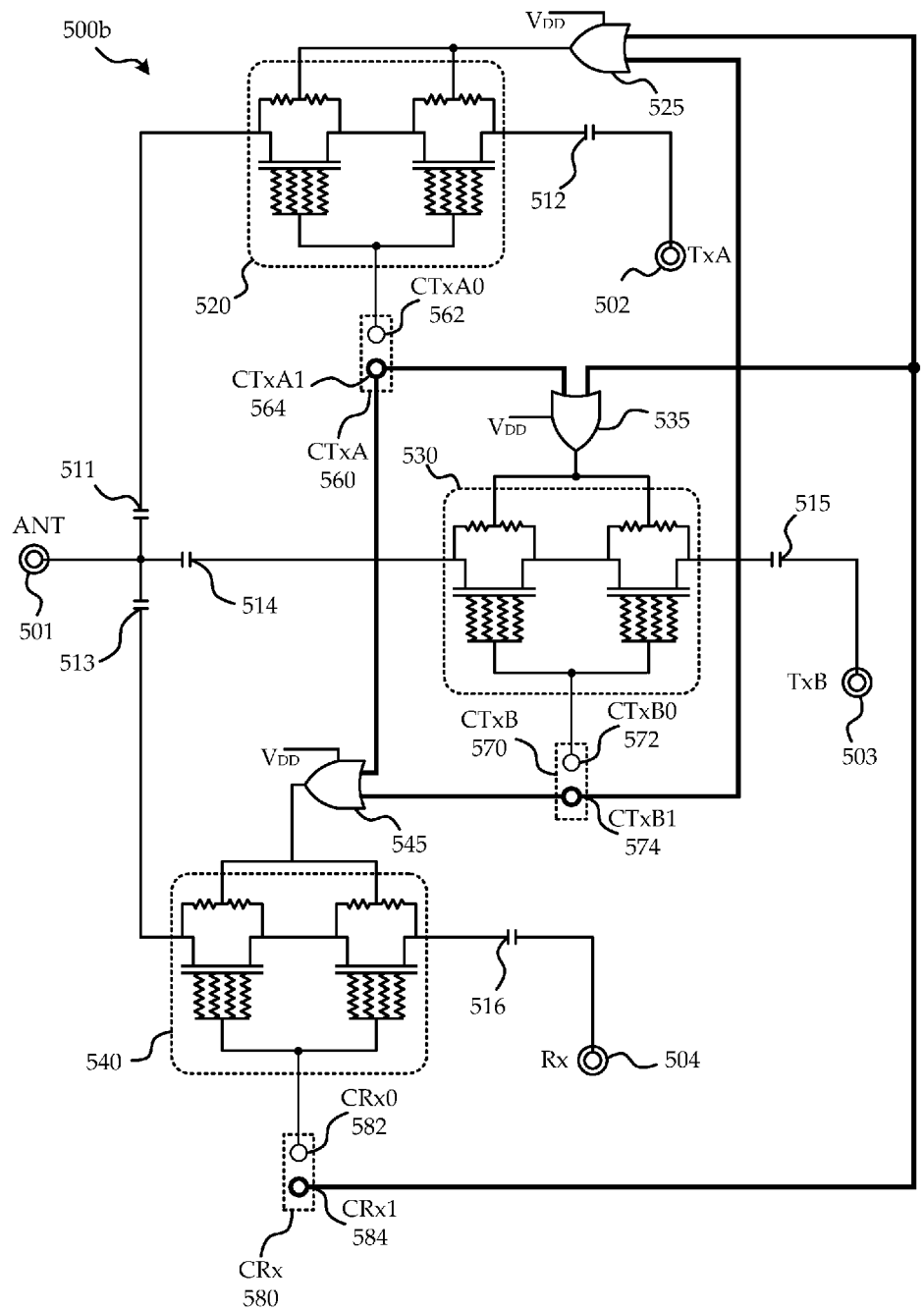
FIG. 5B is a circuit diagram illustrating a single pole triple throw (SP3T) series only switch according to an alternative embodiment of the invention.

Referring now to FIG. 5B, a single pole triple throw (SP3T) series only transmit-receive switch 500b in accordance with another embodiment of the invention will now be discussed.

The SP3T switch 500b illustrated in FIG. 5B differs from the SP3T depicted in FIG. 5A by instead of having two diodes associated with and coupled to each FET group switch, it includes three appropriately coupled "OR" logic gates. Each of the first, second, and third bias controllers 560, 570, 580 is associated with a respective FET group switch 520, 530, 540 by virtue of the primary bias output 562, 572, 582 of the bias controller 560, 570, 580 being coupled to the gate of the respective FET group switch 520, 530, 540. Each of the first, second, and third FET group switches 520, 530, and 540 is coupled at its source/drains to the logic output of a respective first, second, and third "OR" logic gate 525, 535, and 545. Each "OR" logic gate is input with the secondary control voltages of controllers associated with the two FET group switches it does not provide its primary bias output to. For example, the first "OR" logic gate 525 is input with the secondary output of the second and third bias controllers 570, 580, the second "OR" logic gate 535 is input with the secondary output of the first and third bias controllers 560, 580, while the third "OR" logic gate 545 is input with the secondary output of the first and second bias controllers 560, 570. In this implementation, the leakage current at drain-source bias is much less than that achievable by the embodiment depicted in FIG. 5A. Each "OR" logic gate 525, 535, 545 is supplied with a voltage $V_{DD}$ which can be provided from an external voltage source or from analogue circuitry that can detect the logic high control voltage and transfer it into $V_{DD}$ for the "OR" logic gate. It is clear that for a FET group switch is provided with on-state Vgsd at its gates, since the "OR" logic gate it is associated with will receive two low inputs (0.072V) it provides a low logic output (0.072V) to the source/drains of the FET group switch. A FET group which is not provided with an on-state Vgsd at its gates, has 0.105V applied to its gates, and since the "OR" logic gate with which it is associated is input with one high and one low input (1.584V and 0.105V), a voltage of 1.584V is applied to its source/drains resulting in the proper off-state Vgsd of 1.479V.

Figure 6A:
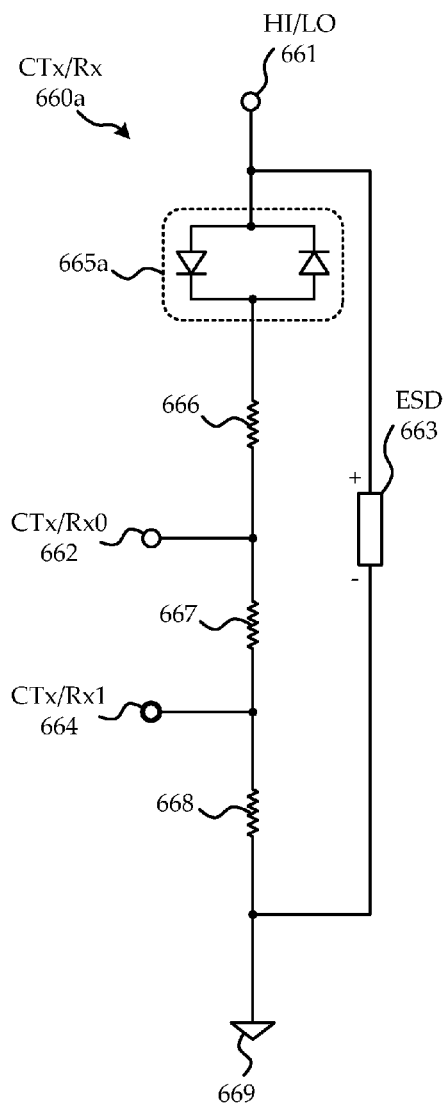
FIG. 6A is a circuit diagram illustrating implementation of a low resistance bias controller according to an embodiment of the invention.

Referring to FIG. 6A, a low resistance bias controller 660a utilizing low resistance to reduce the RC (resistance-capacitance) time constant of the switching gate will now be described.

The low resistance bias controller 660a, is similar to the bias controllers described hereinabove in that it is essentially a voltage divider spanning a HI/LO input terminal 661 and ground 669. The HI/LO input terminal 661 is coupled across a diode loop 665a and a first resistor 666 to a primary bias output 662 which in turn is coupled across a second resistor 667 to a secondary bias output 664 which is coupled across a third resistor 668 to ground 669. Coupled between ground 669 and the HI/LO input terminal 661 is an ESD (Electrostatic discharge) prevention circuit 663 for HBM (human body model) of 200V.

In an embodiment utilizing a $V_{HI}$ of 3.3 V and a $V_{LO}$ of 0.15 V, the first resistor 666 can be chosen to be 1.3 kΩ the second resistor 667 can be chosen to be 1.5 kΩ while the third resistor 668 can be chosen to be 2.2 kΩ When the HI/LO input terminal 661 is at $V_{HI}$, the voltage at the primary bias output 662 is 2.442 V while the voltage at the secondary bias output 664 is 1.452 V. When the HI/LO input terminal 461 is at $V_{LO}$, the voltage at the primary bias output 662 is 0.111 V while the voltage at the secondary bias output port 664 is 0.066 V.

The low resistance bias controller 660a functions the same as the bias controllers described hereinabove except for the reduced RC time constant which speeds up switching. The diode loop 665a, comprises diodes in a dual directional configuration to reduce the control line current leaking to ground which would have otherwise resulted from the drop of resistance levels.

Figure 6B:
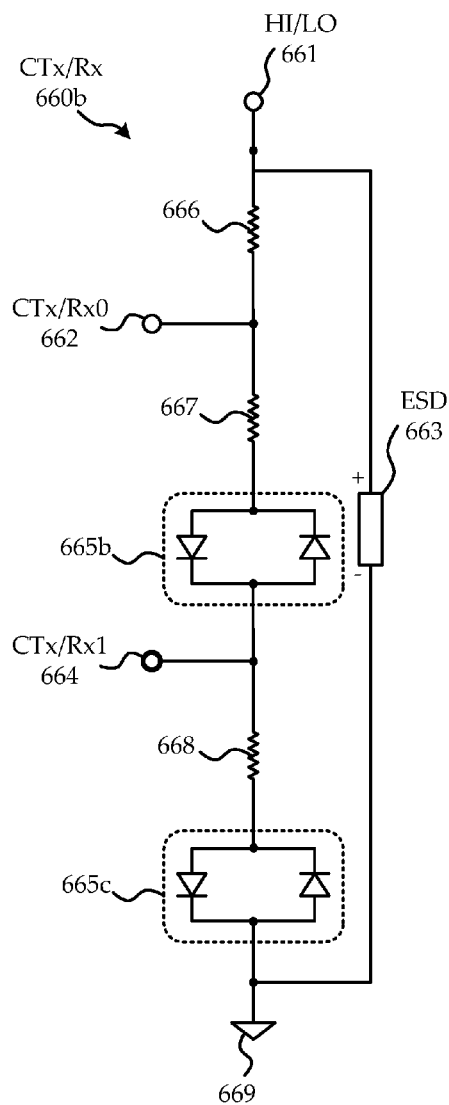
FIG. 6B is a circuit diagram illustrating an alternative implementation of a low resistance bias controller according to an embodiment of the invention.

In a similar embodiment depicted in FIG. 6B, two diode loops 665b, 665c similar to the single diode loop 665a of FIG. 6A are placed within the bias controller 660b between the second resistor 667 and the secondary bias output 664, and between the third resistor 668 and ground 669. This embodiment exhibits much lower leakage at the control lines and much faster turn-on and turn-off time due to the charging and discharging behaviors of the diodes which are much more rapid than that of a resistive ladder. Moreover, the resistors and additional diode loops provide secondary ESD protection to the gates of the switch FETs.

Figure 7A:
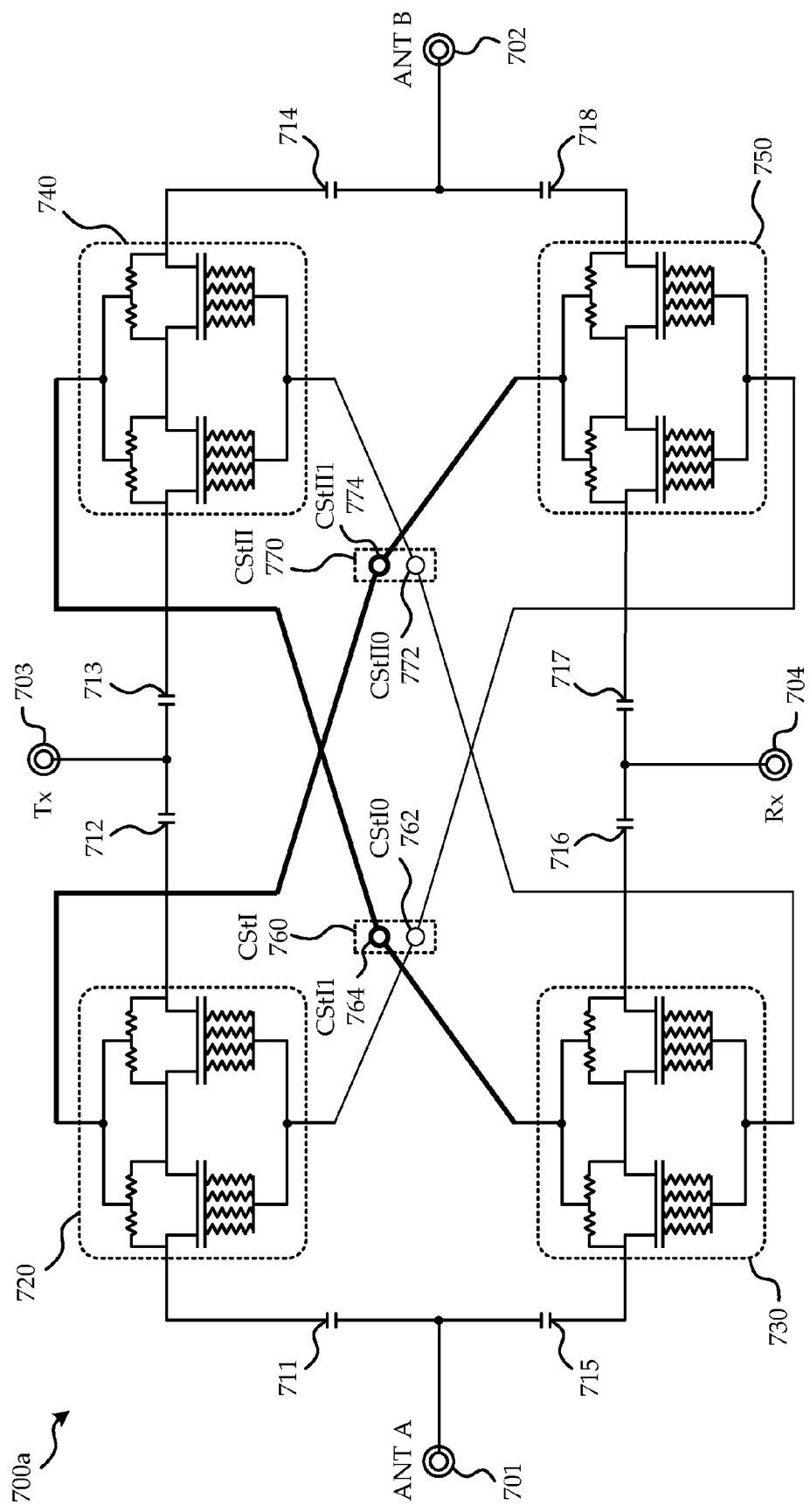
FIG. 7A is a circuit diagram illustrating a double pole double throw (DPDT) series only switch according to an embodiment of the invention.

Referring to FIG. 7A, a double pole dual throw (DPDT) series only transmit-receive switch 700 in accordance with an embodiment of the invention will now be discussed in terms of structure.

The DPDT switch 700a comprises a first antenna 701, a second antenna 702, a transmit terminal 703, and a receive terminal 704. Along a signal path from the first antenna 701 to the transmit terminal 703, the first antenna 701 is coupled to a blocking capacitor 711 coupled in series with a first series FET group switch 720 and another blocking capacitor 712. Along a signal path from the first antenna 701 to the receive terminal 704, the antenna 701 is coupled to a blocking capacitor 715 and coupled in series with a second series FET group switch 730 and another blocking capacitor 716. Along a signal path from the second antenna 702 to the transmit terminal 703, the second antenna 702 is coupled to a blocking capacitor 714 coupled in series with a third series FET group switch 740 and another blocking capacitor 713. Along a signal path from the second antenna 702 to the receive terminal 704, the antenna 702 is coupled to a blocking capacitor 718 and coupled in series with a fourth series FET group switch 750 and another blocking capacitor 717.

As with the embodiments described hereinabove, the gate and source/drain bias connections of the FET group switches are connected to various biasing terminals which ensure that the appropriate on and off-state Vgsd levels are applied across each FET group switch at the appropriate time. As discussed hereinabove, the inventors have identified that the chosen on-state Vgsd levels should be 2.0 V-2.5 V while the chosen off-state Vgsd levels should be 1.1 V-1.5 V. The DPDT circuit 700a has two states of operation. In a first state, the DPDT circuit 700a couples the first antenna 701 with the transmit terminal 703 and couples the second antenna 702 with the receive terminal 704. In a second state, the DPDT circuit 700a couples the first antenna 701 with the receive terminal 704 and couples the second antenna 702 with the transmit terminal 703. To provide these two states, the DPDT circuit 700a has two bias controllers, a first state bias controller 760 and a second state bias controller 770.

A primary bias output 762 of the first state bias controller 760 is coupled to the gate of the first and fourth series FET group switches 720 750. A secondary bias output 764 of the first state bias controller 760 is coupled to the source/drain bias connections of the second and third series FET group switches 730 740. A primary bias output 772 of the second state bias controller 770 is coupled to the gates of the second and third series FET group switches 730 740. A secondary bias output 774 of the second state bias controller 770 is coupled to the source/drain bias connections of the first and fourth series FET group switches 720, 750.

The DPDT switch 700a of FIG. 7A will now be described in terms of its function. In order to reduce spurious harmonic emissions and to improve linearity, the on-state Vgsd is chosen to be at a level between 2.0 V and 2.5 V while the off-state Vgsd is chosen to be at a level between 1.1 V and 1.5 V.

When the DPDT 700a is in the first state, the first antenna 701 is utilized for transmission while the second antenna 702 is utilized for reception. This is achieved by applying $V_{HI}$ to the HI/LO input terminal of the first state bias controller 760 and applying $V_{LO}$ to the HI/LO input terminal of the second state bias controller 770. As with the embodiments described hereinabove, in order to ensure low insertion loss and adequate isolation, in this state, the first and fourth series FET group switches 720, 750 located respectively between the transmit terminal 703 and the first antenna 701 and between the receipt terminal 704 and second antenna 702 are both provided with on-state Vgsd while the second and third FET group switches 730, 740, located respectively between the transmit terminal 703 and the second antenna 702 and between the receive terminal 704 and the first antenna 701 are both provided with off-state Vgsd.

Conversely, when the DPDT 700a is in the second state, the second antenna 702 is utilized for transmission and the first antenna 701 is used for reception. This is achieved by applying $V_{LO}$ to the HI/LO input terminal of the first state bias controller 760 and applying $V_{HI}$ to the HI/LO input terminal of the second state bias controller 770. As with the embodiments described hereinabove, in order to ensure low insertion loss and adequate isolation, in this state, the second and third series FET group switches 730, 740 located respectively between the transmit terminal 703 and the second antenna 702 and between the receipt terminal 704 and first antenna 701 are both provided with on-state Vgsd while the first and fourth series FET group switches 720, 750, located respectively between the transmit terminal 703 and the first antenna 701 and between the receive terminal 704 and the second antenna 702 are both provided with off-state Vgsd.

Figure 7B:
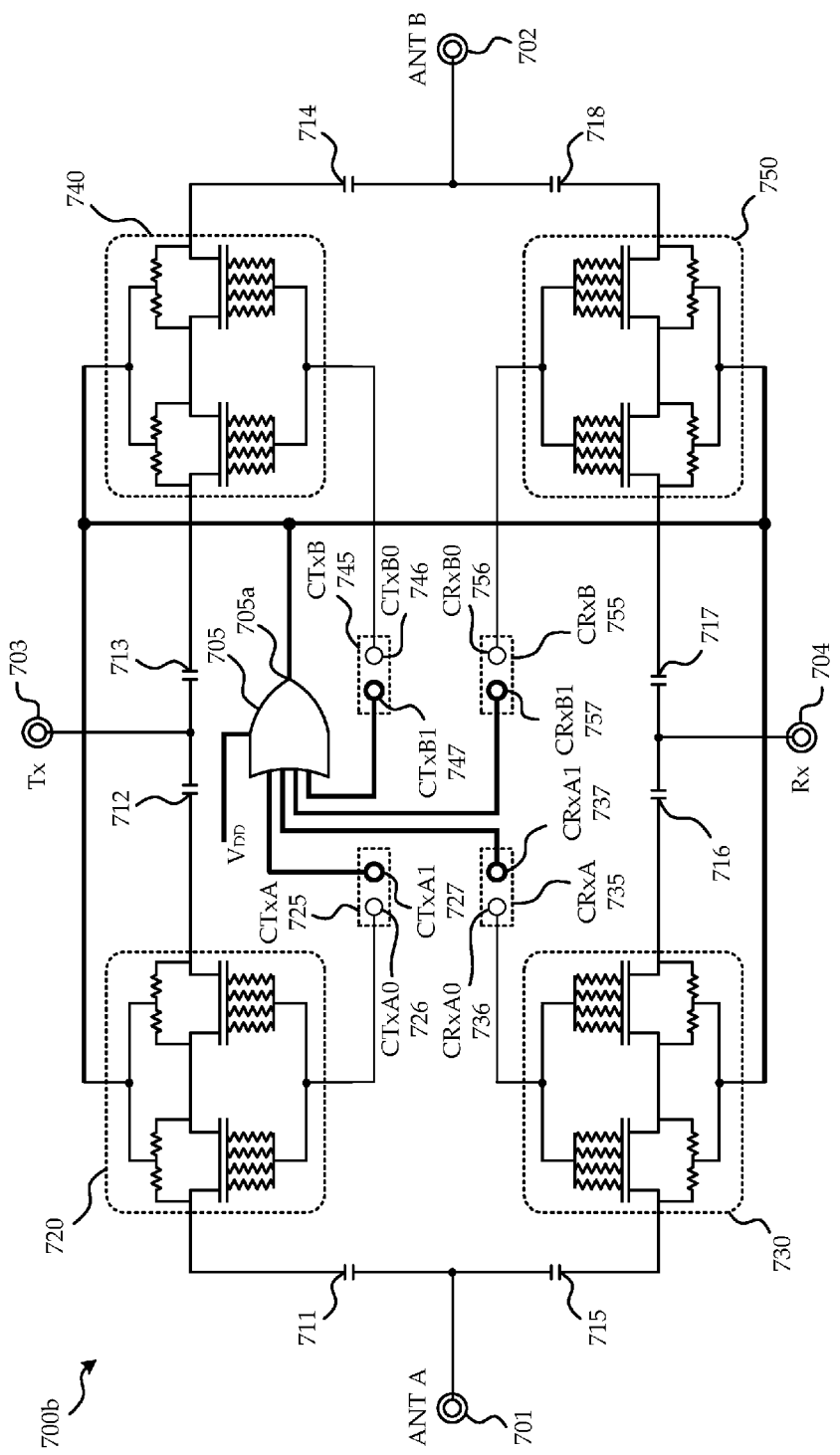
FIG. 7B is a circuit diagram illustrating a double pole double throw (DPDT) series only switch according to an alternative embodiment of the invention.

Referring to FIG. 7B, another double pole dual throw (DPDT) series only transmit-receive switch 700b in accordance with an embodiment of the invention will now be discussed in terms of structure.

The DPDT switch 700b comprises the same capacitors 711, 712, 713, 714, 715, 716, 717, 718, antennas 701, 702, terminals 703, 704, and FET group switches 720, 730, 740, 750 and the same signal pathways connecting these components together, as the DPDT switch 700a depicted in FIG. 7A. The DPDT switch 700b of FIG. 7B, however, does differ from the DPDT switch 700a of FIG. 7A in respect of the bias controllers and associated circuitry used to appropriately bias the FET group switches 720, 730, 740, 750.

As with the embodiments described hereinabove, the gate and source/drain bias connections of the FET group switches are connected through appropriate circuitry to various biasing terminals which ensure that the appropriate on and off-state Vgsd is applied across each FET group switch at the appropriate time. As discussed hereinabove, the inventors have identified that the chosen on-state Vgsd levels should be 2.0 V-2.5 V while the chosen off-state Vgsd levels should be 1.1 V-1.5 V. In the DPDT circuit 700b of FIG. 7B there are four bias controllers, a first transmit bias controller 725, a first receive bias controller 735, a second transmit bias controller 745, and a second receive bias controller 755.

A primary bias output 726 of the first transmit bias controller 725 is coupled to the gate of the first series FET group switch 720. A primary bias output 736 of the first receive bias controller 735 is coupled to the gate of the second series FET group switch 730. A primary bias output 746 of the second transmit bias controller 745 is coupled to the gate of the third series FET group switch 740. A primary bias output 756 of the second receive bias controller 755 is coupled to the gate of the fourth series FET group switch 750.

A respective secondary bias output 727, 737, 747, 757 of the first transmit bias controller 725, the first receive bias controller 735, the second transmit bias controller 745, and the second receive bias controller 755 is coupled to respectively to one of four inputs of a quadruple input "OR" logic gate 705. The quadruple input "OR" logic gate is coupled to power source $V_{DD}$. A logic output 705a of the quadruple input "OR" logic gate 705 is coupled to the source/drain bias connections of each of the first, second, third and fourth FET group switches 720, 730, 740, 750.

The DPDT switch 700b of FIG. 7B will now be described in terms of its function.

As with the embodiments described hereinabove, in order to ensure low insertion loss and adequate isolation, when the first antenna 701 is utilized for transmission, the first FET group switch 720, located between the transmit terminal 703 and the first antenna 701 is provided with on-state Vgsd while the remainder of the FET group switches 730, 740, 750 are provided with off-state Vgsd. Likewise when the second antenna 702 is utilized for transmission, the third FET group switch 740 is provided with on-state Vgsd while the remainder of the FET group switches 720, 730, 750 are provided with off-state Vgsd. When the first antenna 701 is utilized for reception, the second FET group switch 730 is biased with on-state Vgsd while the remainder of the FET group switches 720, 740, 750 are biased with reverse polarity. When the second antenna 702 is utilized for reception, the fourth FET group switch 750 is provided with on-state Vgsd while the remainder of the FET group switches 720, 730, 740 are provided with off-state Vgsd.

In order to reduce spurious harmonic emissions and to improve linearity, the on-state Vgsd is chosen to be at a level between 2.0 V and 2.5 V while the off-state Vgsd is chosen to be at a level between 1.1 V and 1.5 V.

In order to achieve the biasing levels described above, the quadruple input "OR" logic gate 705 is arranged to produce a 1.1V-1.5V logic high and 0V logic low signal from its logic output 705a. Moreover, the internals (resistors and/or diodes) of the controllers are set to provide a ratio such that the primary outputs thereof, when the controller receives $V_{HI}$ at its HI/LO input terminal, provides a voltage which is at least 2.0V-2.5V more the 1.1V-1.5V output from the quadruple input "OR" logic gate 705. The voltages of the primary bias outputs of the bias controllers may be shifted if required, or if the quadruple input "OR" logic gate provides a logic high signal of 1.15V the primary outputs of each bias controller can be set to provide 3.2V by appropriate configuration of internals.

When the DPDT switch 700b is utilized for transmission over the first antenna 701, $V_{HI}$ is applied to the HI/LO input terminal of the first transmit bias controller 725 while $V_{LO}$ is applied to the HI/LO input terminals of the remainder of the bias controllers 735, 745, 755, and when the DPDT switch 700b is utilized for transmission over the second antenna 702, $V_{HI}$ is applied to the HI/LO input terminal of the second transmit bias controller 745 while $V_{LO}$ is applied to the HI/LO input terminals of the remainder of the bias controllers 725, 735, 755.

Additionally, when the DPDT switch 700b is utilized for reception over the first antenna 701, $V_{HI}$ is applied to the HI/LO input terminal of the first receive bias controller 735 while $V_{LO}$ is applied to the HI/LO input terminals of the remainder of the bias controllers 725, 745, 755, and when the DPDT switch 700b is utilized for reception over the second antenna 702, $V_{HI}$ is applied to the HI/LO input terminal of the second receive bias controller 755 while $V_{LO}$ is applied to the HI/LO input terminals of the remainder of the bias controllers 725, 735, 745.

Figure 8A:
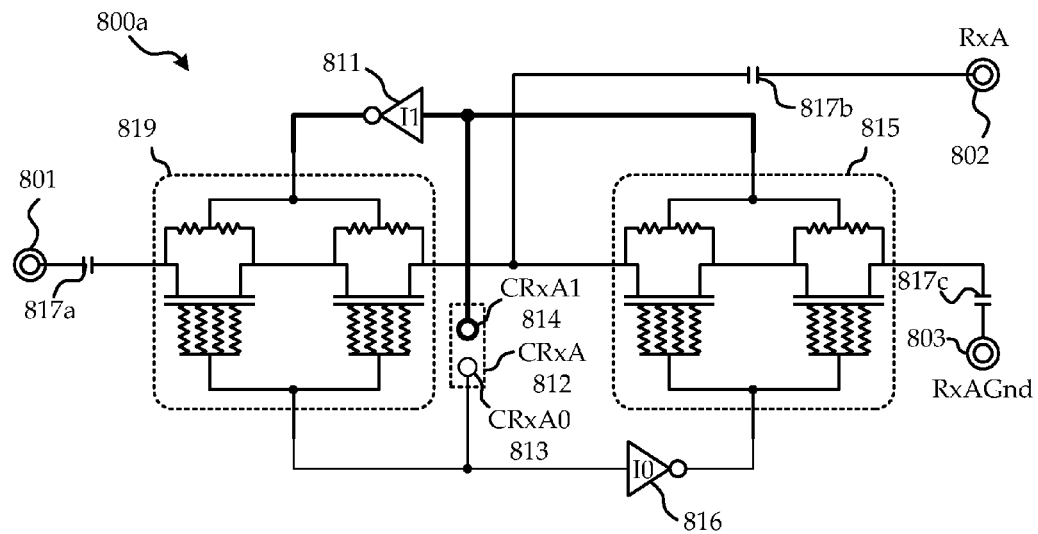
FIG. 8A is a circuit diagram of a decoupled series and shunt path circuit according to an embodiment of the invention.

Referring to FIG. 8A, a decoupled series shunt path circuit generally indicated by the numeral 800a, according to an embodiment of the invention will now be discussed in terms of structure.

The decoupled series and shunt path circuit 800a spans a signal pathway from a receive terminal 802 to an antenna 801, and a shunt pathway from the receive terminal 802 to a ground connection 803. Along a signal path from the antenna 801 to the receive terminal 802, the antenna 801 is coupled to a blocking capacitor 817a coupled in series with a series FET group switch 819 and another blocking capacitor 817b. Along a signal path from the receive terminal 802 to the ground connection 803, the receive terminal 802 is coupled to the blocking capacitor 817b coupled in series with a shunt FET group switch 815 and a further blocking capacitor 817c.

A single receive bias controller 812 similar to that depicted in FIG. 4A along with a primary inverter 816 and a secondary inverter 811 provide the required on and off-state Vgsd signals to the FET group switches 819, 815. A primary bias output 813 of the receive bias controller 812 is coupled to a gate of the series FET group switch 819, and is also coupled to an input of the primary inverter 816 whose output is coupled to the gate of the shunt FET group switch 815. A secondary bias output 814 of the receive bias controller 812 is coupled to the source/drains of the shunt FET group switch 815, and is also coupled to an input of the secondary inverter 811 whose output is coupled to the source/drains of the series FET group switch 819.

The primary inverter 816 is a scaled voltage inverter in that it outputs 0V when a signal of 2.31V is applied to its input, and outputs 2.31V when 0V is applied to its input. The secondary inverter 811 is also a scaled voltage inverter, providing an output of 0V when input with 1.584V and providing an output of 1.584V when input with 0V.

The decoupled series and shunt path circuit 800a will now be discussed in terms of function.

When the series and shunt path circuit 800a is used for reception, the single receive bias controller 812 is input with a $V_{HI}$ signal of 3.3V at its HI/LO input terminal. This causes 2.31V to be output from its primary output 813 and applied to the gate of the series FET group switch 819, and to the input of the secondary inverter 816, and also causes 1.584V to be output from its secondary output 814 and applied to the source/drains of the shunt FET group switch 815, and the input of the secondary inverter 811. The primary inverter 816 and the secondary inverter 811 therefore both output a low signal of 0V, and as a result, the series FET group switch 819 is provided an on-state Vgsd of 2.31V, while the shunt FET group switch 815 is provided an off-state Vgsd of 1.584V. These are the chosen ranges described in association with the embodiments described above for on and off-state Vgsd biasing to allow reception while isolating the signal path from ground.

When the series and shunt path circuit 800a is not used for reception, the single receive bias controller 812 is input with a $V_{LO}$ signal at its HI/LO input terminal. This causes 0.105V to be output from its primary output 813 and applied to the gate of the series FET group switch 819, and to the input of the primary inverter 816, and also causes 0.072V to be output from its secondary output 814 and applied to the source/drains of the shunt FET group switch 815, and an input of the secondary inverter 811. The primary inverter 816 therefore outputs a signal of 2.31V and applies it to the gate of the shunt FET group switch 815 while the secondary inverter 811 outputs a signal of 1.584V and applies it to the source/drains of the series FET group switch 819. As a result, the shunt FET group switch 815 is provided an on-state Vgsd level of 2.238V, while the series FET group switch 819 is provide an off-state Vgsd level of 1.479V. These are within the chosen ranges in order to reduce spurious harmonic emissions and to improve linearity as described above for on and off-state Vgsd biases to block reception while shunting the receive terminal 802 to ground.

Figure 8B:
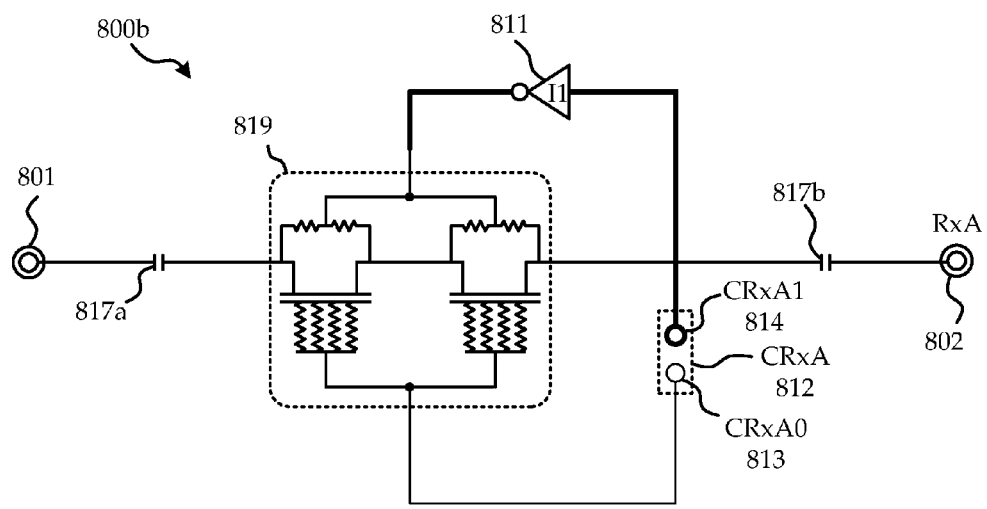
FIG. 8B is a circuit diagram of a decoupled series only path circuit according to an embodiment of the invention.

Referring to FIG. 8B, a decoupled series only path circuit generally indicated by the numeral 800b, according to an embodiment of the invention will now be discussed in terms of structure.

The decoupled series only path circuit 800b spans a signal pathway from a receive terminal 802 to an antenna 801. Along a signal path from the antenna 801 to the receive terminal 802, the antenna 801 is coupled to a blocking capacitor 817a coupled in series with a series FET group switch 819 and another blocking capacitor 817b.

A single receive bias controller 812 similar to that depicted in FIG. 4A along with a secondary inverter 811 provide the required on and off-state Vgsd signals to the series FET group switch. A primary bias output 813 of the receive bias controller 812 is coupled to a gate of the series FET group switch 819. A secondary bias output 814 of the off-state Vgsd controller 812 is coupled to an input of the secondary inverter 811 whose output is coupled to the source/drains of the series FET group switch 819.

As with the embodiment depicted in FIG. 8A, the secondary inverter 811 is a scaled voltage inverter, providing an output of 0V when input with 1.584V and providing an output of 1.584V when input with 0V.

The decoupled series and shunt path circuit 800b will now be discussed in terms of function.

When the series only path circuit 800b is used for reception, the single receive bias controller 812 is input with a $V_{HI}$ signal of 3.3V at its HI/LO input terminal. This causes 2.31V to be output from its primary output 813 and applied to the gate of the series FET group switch 819, and also causes 1.584V to be output from its secondary output 814 and applied to the input of the secondary inverter 811. The secondary inverter 811 therefore outputs a low signal of 0V, and as a result, the series FET group switch 819 is provided an on-state Vgsd level of 2.31V. This is within the chosen range in order to reduce spurious harmonic emissions and to improve linearity as described above for on-state Vgsd levels to allow reception.

When the series only path circuit 800b is not used for reception, the single receive bias controller 812 is input with a $V_{LO}$ signal at its HI/LO input terminal. This causes 0.105V to be output from its primary output 813 and applied to the gate of the series FET group switch 819, and also causes 0.072V to be output from its secondary output 814 and applied to the input of the secondary inverter 811. The secondary inverter 811 therefore outputs a signal of 1.584V and applies it to the source/drains of the series FET group switch 819. As a result, the series FET group switch 819 is provided with an off-state Vgsd level of 1.479V. This is within the chosen range in order to reduce spurious harmonic emissions and to improve linearity as described above for off-state Vgsd levels to block reception.

The series and shunt path circuits 800a and/or the series only path circuits 800b of FIGS. 8A and 8B may be used in various switch implementations and have the advantage of creating decoupled switch pathways and not requiring the routing of bias controller outputs to nonlocal circuit or shunt paths. One drawback of utilizing the circuits depicted in FIGS. 8A and 8B is the requirement for an external voltage supply for the voltage scaled inverters.

Figure 9:
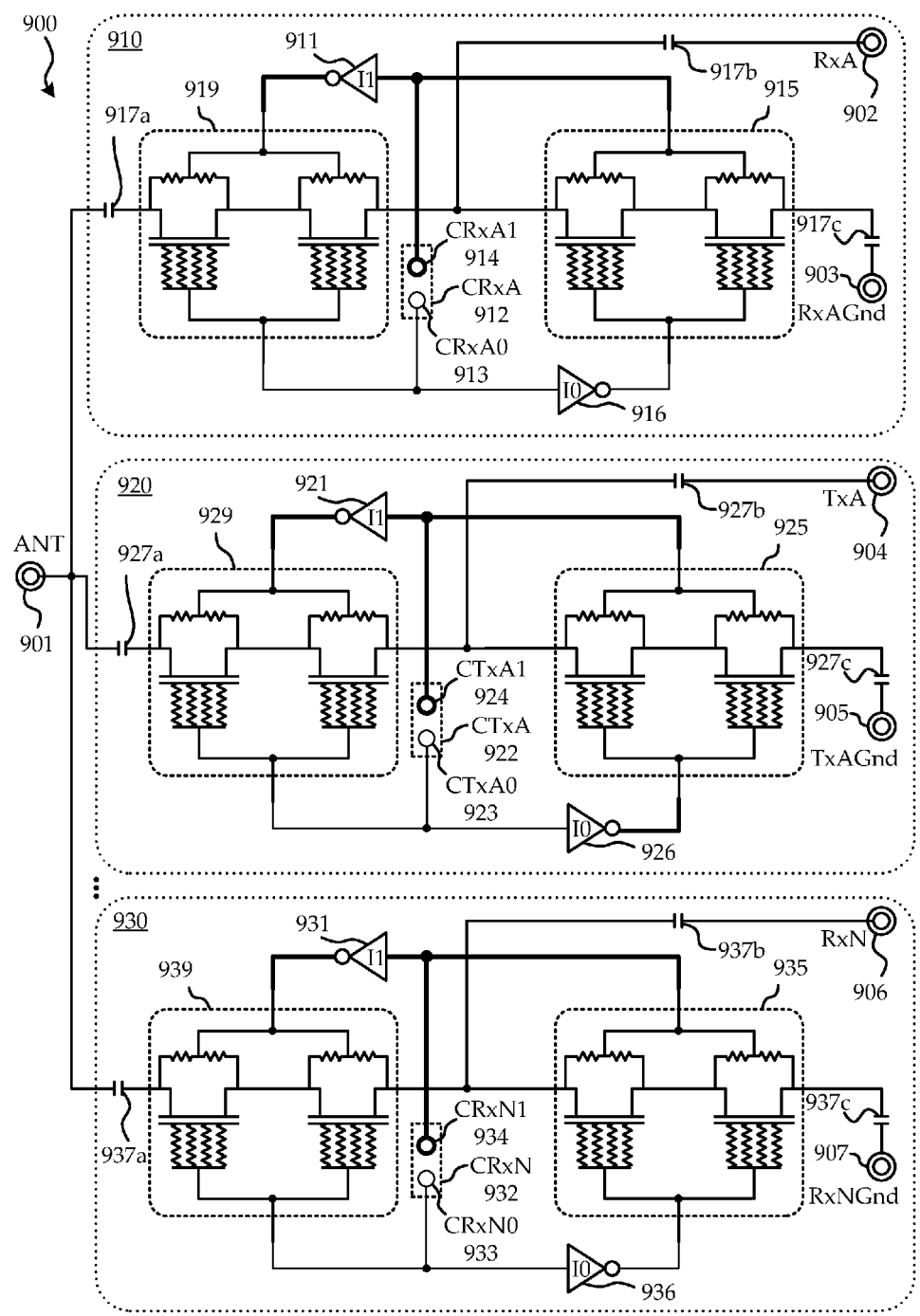
FIG. 9 is a single pole N throw switch implementing decoupled series and shunt path circuits according to an embodiment of the invention.

Referring now to FIG. 9, a single pole N throw (SPNT) series and shunt switch 900 in accordance with another embodiment of the invention will now be discussed. This SPNT switch 900 utilizes a number of decoupled series and shunt path circuits similar to that depicted in FIG. 8A.

The SPNT switch 900 comprises N receive or transmit series and shunt path circuits, of which three are shown, a first receive series and shunt path circuit 910, a first transmit series and shunt path circuit and an Nth series and shunt path circuit 930 which happens to be a receive series and shunt path circuit. All of the series and shunt path circuits 910, 920, 930 of the SPNT switch 900 are coupled to a single antenna 901. Each series and shunt path circuit 910, 920, 930 is structured and functions like the series and shunt path circuit depicted in FIG. 8A. Each spanning a signal path between the antenna 901 and the respective receive or transmit terminal (such as a first receive terminal 902, first transmit terminal 904, and so on). Each series and shunt path circuit comprises its own shunt path to ground and the associated bias controller and inverters as depicted in FIG. 8A.

To connect any series and shunt path terminal 902, 904, 906 to the antenna 901, the bias controller 912, 922, 932 of that series and shunt path circuit 910, 920, 930 is input at its HI/LO input terminal with $V_{HI}$ while the bias controllers of the remaining series and shunt path circuits (those which are not to be coupled to the antenna but instead are shunted to ground) are input at their HI/LO input terminals with $V_{LO}$. This provides the proper switching in the SPNT switch while maintaining the chosen on-state Vgsd level of 2.31V along with the chosen off-state Vgsd level of 1.479V in order to reduce spurious harmonic emissions and to improve linearity.

Figure 10:
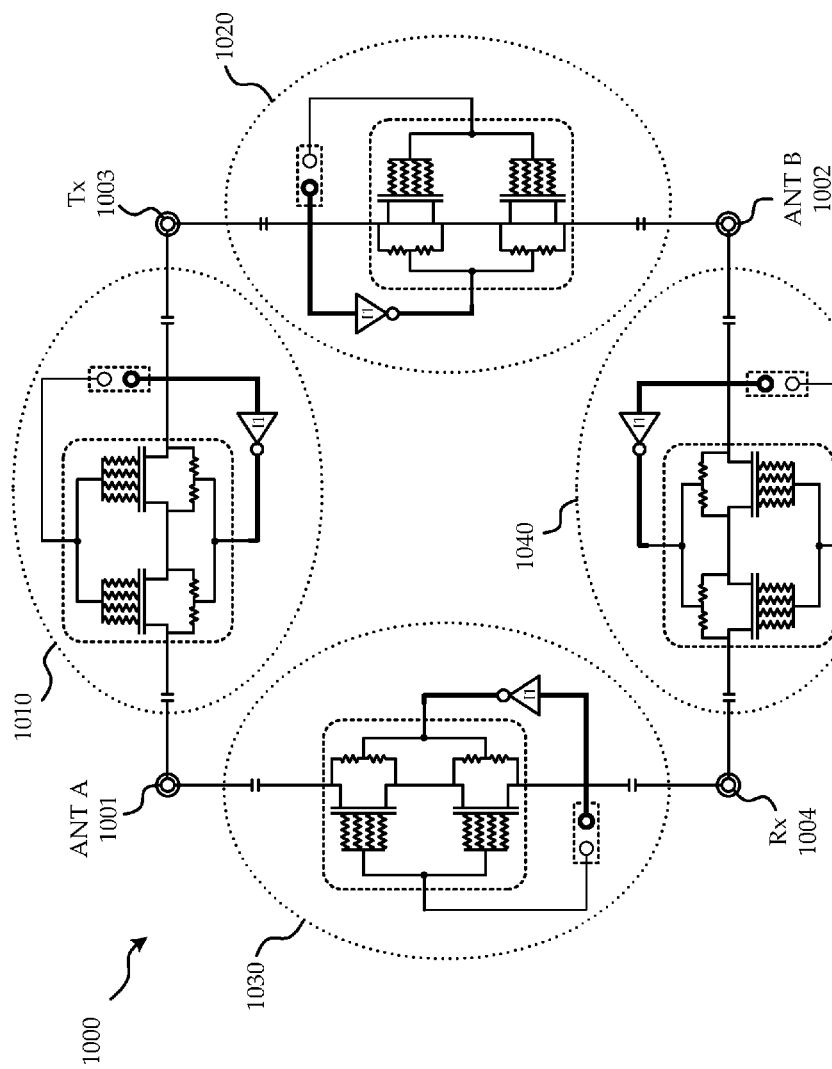
FIG. 10 is a circuit diagram illustrating a double pole double throw (DPDT) shunted switch implementing decoupled series and shunt path circuits according to an embodiment of the invention.

Referring to FIG. 10, a dual pole dual throw (DPDT) transmit-receive switch 1000 in accordance with an embodiment of the invention will now be discussed in terms of its structure. The DPDT 1000 of FIG. 10 utilizes four decoupled series only path circuits 1010, 1020, 1030, 1040 similar to that depicted in FIG. 8A.

The DPDT switch 1000 comprises a first antenna 1001, a second antenna 1002, a transmit terminal 1003, and a receive terminal 1004.

The first antenna 1001, is coupled to the transmit terminal 1003, though a first series only path circuit 1010, and the second antenna 1002 is coupled to the transmit terminal 1003 through a second series only path circuit 1020. The first antenna 1001 is coupled to the receive terminal 1004 through a third series only path circuit 1030 and the second antenna 1002 is coupled to the receive terminal 1004 through a fourth series only path circuit 1040.

The first, second, third, and fourth series only path circuits 1010, 1020, 1030, 1040 are each structured the same and functions the same as the series only path circuit 800b depicted in FIG. 8B.

The a signal path is used between an antenna 1001, 1002 and a terminal 1003, 1004, the bias controller of the series only path circuit spanning the two is input at its HI/LO input terminal with a $V_{HI}$ signal, while the bias controllers of the series only path circuits spanning the rest of the DPDT switch 1000 are input at their HI/LO input terminals with a $V_{LO}$ signal. This causes an on-state Vgsd at a level of 2.31V and off-state Vgsd of 1.479V which are within the range chosen in order to reduce spurious harmonic emissions and to improve linearity as described above.

It should be noted that the DPDT switch depicted in FIG. 10 may be used for a single signal pathway between an antenna and one of the receive and transmit terminals, it may also be used for transmission over one antenna while at the same time reception over another antenna, if such was required.

Although each embodiment has been described as utilizing FET group switches comprising two MUGFETs, it should be understood that other implementations may utilize any suitable number and combination of MOSFETs, MUGFETs, and/or any other suitable type(s) of transistor switches.

Although the embodiments depicted in FIG. 2, FIG. 5A, FIG. 5B, FIG. 7A, FIG. 7B, FIG. 8A, FIG. 8B, FIG. 9, and FIG. 10, identify the input and output terminals as being a specific one of a receive or a transmit terminal, alternative embodiments possess a similar architecture to those depicted but with one or more receive or transmit terminals substituted with one or more transmit or receive terminal's respectively.

Although specific implementations of receive-transmit switches have been illustrated hereinabove, it is to be understood that dissimilar on and off-state Vgsd levels of the semiconductor transistor based switches in a high power receive transmit switch may be utilized in a great number of various switching architectures.

Although the bias controllers depicted hereinabove are implemented in a specific manner in accordance with a voltage divider, other architectures for producing a primary and a secondary biasing voltage which is in accordance with the identification of the chosen voltages of 2.0 V to 2.5 V in respect of on-state Vgsd and 1.1 V to 1.5 V in respect of off-state Vgsd may be implemented.

The embodiments presented are exemplary only and persons skilled in the art would appreciate that variations to the embodiments described above may be made without departing from the spirit of the invention. The scope of the invention is solely defined by the appended claims.

What is claimed is:

1. A method of biasing transistor switches in a high power switch, the method comprising:
   providing on-state Vgsd (gate to source/drain bias voltage) at an on-state Vgsd level to a first transistor switch of said transistor switches for biasing the first transistor switch in an on state; and
   providing off-state Vgsd at an off-state Vgsd level to a second transistor switch of said transistor switches for biasing the second transistor switch in an off state, wherein a magnitude of the off-state Vgsd level is less than a magnitude of the on-state Vgsd level by only an amount sufficient for at least one of:
      bringing spurious harmonic emissions of said second transistor switch when biased to the off state below a pre-identified upper limit of acceptable spurious harmonic emissions from the second transistor switch in the off state; and
      bringing a linearity of the high power switch above a pre-identified lower limit of acceptable linearity for the high power switch.

2. A method according to claim 1 further comprising:
   identifying at least one of the upper limit of acceptable spurious harmonic emissions from the second transistor switch in the off state, and the lower limit of acceptable linearity for the high power switch.

3. A method according to claim 1 wherein the on-state Vgsd level is a maximum potential difference between gate and one of the source or drain within reliability and operating constraints of the transistor switches.

4. A method according to claim 1 wherein said off-state Vgsd level is a fixed fraction of said on-state Vgsd level.

5. A method according to claim 1 wherein said transistor switches are silicon-on-insulator FET switches, and wherein said on-state Vgsd level is between 2.0 V and 2.5 V, and wherein the off-state Vgsd level is between 1.1 V and 1.5 V.

6. A method according to claim 4 wherein providing the on-state Vgsd comprises biasing at a gate of the first transistor switch with an on-state gate voltage at a fixed primary biasing fraction of a high system control voltage and biasing at a source-drain of the first transistor switch with a on-state source-drain voltage at a fixed secondary biasing fraction of a low system control voltage, and wherein providing off-state Vgsd comprises biasing at a gate of the second transistor switch with a off-state gate voltage at the fixed primary biasing fraction of the low system control voltage and biasing at a source-drain of the second transistor switch with a off-state source-drain voltage at the fixed secondary biasing fraction of the high system control voltage.

7. A method according to claim 6, wherein the fixed primary biasing fraction and the fixed secondary biasing fraction of the high and low system control voltages are generated by voltage dividing the high and low system control voltages respectively.

8. A method according to claim 1 wherein the high power switch comprises an antenna, a first input/output terminal, and a second input/output terminal, wherein the first transistor switch is located along a first signal path from the antenna to the first input/output terminal, and the second transistor switch is located along a second signal path from the antenna to the second input/output terminal, and wherein the step of providing the on-state Vgsd to the first transistor switch is performed to provide a communication pathway between the antenna and the first input/output terminal, and the step of providing the off-state Vgsd to the second transistor switch is performed to isolate the antenna and the first input/output terminal from the second input/output terminal.

9. A method according to claim 8 further comprising:
   providing on-state Vgsd at the on-state Vgsd level to the second transistor switch for biasing the second transistor switch in an on state; and
   providing off-state Vgsd at the off-state Vgsd level to the first transistor switch for biasing the first transistor switch in an off state,
   wherein the step of providing the on-state Vgsd to the second transistor switch is performed to provide a communication pathway between the antenna and the second input/output terminal, and the step of providing the off-state Vgsd to the first transistor switch is performed to isolate the antenna and the second input/output terminal from the first input/output terminal.

10. A method according to claim 1 wherein the high power switch comprises an antenna, a first input/output terminal, and a first ground connection, wherein the first transistor switch is located along a signal path from the first input/output terminal to the antenna, and the second transistor switch is located along a shunt path from the first input/output terminal to the first ground connection, and wherein the step of providing on-state Vgsd is performed to provide a communication pathway between the first input/output terminal and the antenna, and the step of providing off-state Vgsd is performed to isolate the antenna and the first input/output terminal from the first ground connection.

11. A method according to claim 10 wherein the high power switch comprises a second input/output terminal, and a third transistor switch of the transistor switches, wherein the third transistor switch is located along a signal path from the antenna to the second input/output terminal, wherein the step of providing the off-state Vgsd to the second transistor switch is performed in association with a step of:
   providing off-state Vgsd at the off-state Vgsd level to the third transistor switch for biasing the third transistor switch in the off state,
and wherein the step of providing off-state Vgsd to the third transistor switch is performed to isolate the antenna and the first input/output terminal from the second input/output terminal.

12. A method according to claim 11 further comprising:
   providing on-state Vgsd at the on-state Vgsd level to the second transistor switch for biasing the second transistor switch in an on state; and
   providing off-state Vgsd at the off-state Vgsd level to the first transistor switch for biasing the first transistor switch in an off state, and providing on-state Vgsd at the on-state Vgsd level to the third transistor switch for biasing the third transistor switch to an on state, wherein the step of providing on-state Vgsd to the second transistor switch is performed to provide a shunt pathway between the first input/output terminal and the first ground connection, the step of providing on-state Vgsd to the third transistor switch is performed to provide a communication pathway between the second input/output terminal and the antenna, and the step of providing off-state Vgsd to the first transistor switch is performed to isolate the antenna and the second input/output switch from the first input/output terminal and the first ground connection.

13. A method according to claim 11 wherein the high power switch comprises a second ground connection and a fourth transistor switch of the transistor switches, wherein the fourth transistor switch is located along a signal path from the second input/output terminal to the second ground connection, wherein the step of providing off-state Vgsd to the second transistor switch is performed in association with a step of:

providing on-state Vgsd at the on-state Vgsd level to the fourth transistor switch for biasing the fourth transistor switch in the on state, wherein the step of providing off-state Vgsd to the third transistor switch is performed also to isolate the antenna and the first input/output terminal from the second ground connection, and wherein the step of providing on-state Vgsd to the fourth transistor switch is performed to provide a shunt pathway from the second input/output terminal to the second ground connection.

14. A method according to claim 13 further comprising:

providing on-state Vgsd at the on-state Vgsd level to the second transistor switch for biasing the second transistor switch in an on state;

providing off-state Vgsd at the off-state Vgsd level to the first transistor switch for biasing the first transistor switch in an off state;

providing on-state Vgsd at the on-state Vgsd level to the third transistor switch for biasing the third transistor switch to an on state; and providing off-state Vgsd at the off-state Vgsd level to the fourth transistor switch for biasing the fourth transistor switch in an off state, wherein the step of providing on-state Vgsd to the second transistor switch is performed to provide a shunt pathway between the first input/output terminal and the first ground connection, wherein the step of providing on-state Vgsd to the third transistor switch is performed to provide a communication pathway between the second input/output terminal and the antenna, wherein the step of providing off-state Vgsd to the first transistor switch is performed to isolate the antenna and the second input/output terminal from the first input/output terminal and the first ground connection, and wherein the step of providing off-state Vgsd to the fourth transistor switch is performed to isolate the antenna and the second input/output switch from the second ground connection.

15. A method of biasing transistor switches in a high power switch, the method comprising:

biasing at a gate of a first transistor switch of the transistor switches with a first biasing controller at a fixed primary biasing fraction of a first control voltage input to the first biasing controller;

biasing at a source-drain of the first transistor switch with a second biasing controller at a fixed secondary biasing fraction of a second control voltage input to the second biasing controller;

biasing at a gate of a second transistor switch of the transistor switches with the second biasing controller at the fixed primary biasing fraction of the second control voltage input; and biasing at a source-drain of the second transistor switch with the first biasing controller at the fixed secondary biasing fraction of the first control voltage;

wherein when the high power switch is in a first switch state in which the first transistor switch is on and the second transistor switch is off:

providing a high system control voltage as the first control voltage to the first basing controller; and providing a low system control voltage as the second control voltage to the second biasing controller, wherein when the high power switch is in a second switch state in which the first transistor switch is off and the second transistor switch is on:

providing a low system control voltage as the first control voltage to the first basing controller; and providing a high system control voltage as the second control voltage to the second biasing controller, wherein:

a magnitude of the difference between the product of the primary biasing fraction and the low system control voltage and the product of the secondary biasing fraction and the high system control voltage is less than a magnitude of the difference between the product of the primary biasing fraction and the high system control voltage and the product of the secondary biasing fraction and the low system control voltage by only an amount sufficient for at least one of:

bringing spurious harmonic emissions of said second transistor switch when biased to the off state below a pre-identified upper limit of acceptable spurious harmonic emissions from the second transistor switch in the off state; and bringing a linearity of the high power switch above a pre-identified lower limit of acceptable linearity for the high power switch.

16. A high power switch comprising:

a plurality of transistor switches comprising:

a first transistor switch; and a second transistor switch, biasing circuitry for providing, when the high power switch is in a first high power switch state:

on-state Vgsd at a on-state Vgsd level to the first transistor switch for biasing the first transistor switch in an on state; and off-state Vgsd at a off-state Vgsd level to the second transistor switch for biasing the second transistor switch in an off state, wherein a magnitude of the off-state Vgsd level is less than a magnitude of the on-state Vgsd level by only an amount sufficient for at least one of:

bringing spurious harmonic emissions of said second transistor switch when biased to the off state below a pre-identified upper limit of acceptable spurious harmonic emissions from the second transistor switch in the off state; and bringing a linearity of the high power switch above a pre-identified lower limit of acceptable linearity for the high power switch.

17. A switch according to claim 16 wherein the on-state Vgsd level is a full-on on-state Vgsd level within reliability and operating constraints of each transistor switch of the plurality of transistor switches.

18. A switch according to claim 16 wherein said off-state Vgsd level is a fixed fraction of said on-state Vgsd level.

19. A switch according to claim 16 wherein each transistor switch of said plurality of switches is a silicon on insulator FET switch, and wherein said on-state Vgsd level is between 2.0 V and 2.5 V, and wherein the off-state Vgsd level is between 1.1 V and 1.5 V.

20. A switch according to claim 18 wherein when the high power switch is in the first high power switch state, the biasing circuitry provides on-state Vgsd to the first transistor switch by biasing at a gate of the first transistor switch with a on-state gate voltage at a fixed primary biasing fraction of a high system control voltage and biasing at a source-drain of the first transistor switch with a on-state source-drain voltage at a fixed secondary biasing fraction of a low system control voltage, and the biasing circuitry provides off-state Vgsd to the second transistor switch by biasing at a gate of the second transistor switch with a off-state gate voltage at the fixed primary biasing fraction of the low system control voltage and biasing at a source-drain of the second transistor switch with a off-state source-drain voltage at the fixed secondary biasing fraction of the high system control voltage.

21. A switch according to claim 20, wherein the biasing circuitry comprises at least one voltage divider circuit for providing the fixed primary biasing fraction and the fixed secondary biasing fraction of the high and low system control voltages.

22. A switch according to claim 16 further comprising:
an antenna,
a first input/output terminal; and
a second input/output terminal,
wherein the first transistor switch is located along a first signal path from the antenna to the first input/output terminal, and the second transistor switch is located along a second signal path from the antenna to the second input/output terminal, wherein when the high power switch is in the first high power switch state the biasing circuitry:
provides on-state Vgsd to the first transistor switch to provide a communication pathway between the antenna and the first input/output terminal; and
provides off-state Vgsd to the second transistor switch to isolate the antenna and the first input/output terminal from the second input/output terminal.

23. A switch according to claim 22 wherein the biasing circuitry is further for providing, when the high power switch is in a second high power switch state:
on-state Vgsd at the on-state Vgsd level to the second transistor switch for biasing the second transistor switch in an on state; and
off-state Vgsd at the off-state Vgsd level to the first transistor switch for biasing the first transistor switch in an off state,
wherein when the high power switch is in the second high power switch state, the biasing circuitry:
provides on-state Vgsd to the second transistor switch to provide a communication pathway between the antenna and the second input/output terminal; and
provides off-state Vgsd to the first transistor switch to isolate the antenna and the second input/output terminal from the first input/output terminal.

24. A switch according to claim 16 further comprising:
an antenna;
a first input/output terminal; and
a first ground connection,
wherein the first transistor switch is located along a signal path from the first input/output terminal to the antenna, and the second transistor switch is located along a shunt path from the first input/output terminal to the first ground connection, and wherein when the high power switch is in the first high power switch state, the biasing circuitry:
provides on-state Vgsd to the first transistor switch to provide a communication pathway between the first input/output terminal and the antenna; and
provides off-state Vgsd to the second transistor switch to isolate the antenna and the first input/output terminal from the first ground connection.

25. A switch according to claim 24 further comprising:
a second input/output terminal; and
a third transistor switch of the plurality of transistor switches,
wherein the third transistor switch is located along a signal path from the antenna to the second input/output terminal, wherein the biasing circuitry is further for providing, when the high power switch is in the first high power switch state, off-state Vgsd at the off-state Vgsd level to the third transistor switch for biasing the third transistor switch in the off state, and wherein when the high power switch is in the first high power switch state, the biasing circuit provides off-state Vgsd to the third transistor switch to isolate the antenna and the first input/output terminal from the second input/output terminal.

26. A switch according to claim 25 wherein the biasing circuitry is further for providing, when the high power switch is in a second high power switch state:
on-state Vgsd at the on-state Vgsd level to the second transistor switch for biasing the second transistor switch in an on state; and
off-state Vgsd at the off-state Vgsd level to the first transistor switch for biasing the first transistor switch in an off state, and
on-state Vgsd at the on-state Vgsd level to the third transistor switch for biasing the third transistor switch to an on state,
wherein when the high power switch is in the second high power switch state, the biasing circuitry:
provides on-state Vgsd to the second transistor switch to provide a shunt pathway between the first input/output terminal and the first ground connection;
provides on-state Vgsd to the third transistor switch to provide a communication pathway between the second input/output terminal and the antenna; and
provides off-state Vgsd to the first transistor switch to isolate the antenna and the second input/output switch from the first input/output terminal and the first ground connection.

27. A switch according to claim 25 further comprising:
a second ground connection; and
a fourth transistor switch of the plurality of transistor switches,
wherein the fourth transistor switch is located along a signal path from the second input/output terminal to the second ground connection, wherein the biasing circuit is further for providing, when the high power switch is in the first high power switch state, on-state Vgsd at the on-state Vgsd level to the fourth transistor switch for biasing the fourth transistor switch in the on state, wherein when the high power switch is in the first high power switch state, the biasing circuitry provides off-state Vgsd to the third transistor switch also to isolate the antenna and the first input/output terminal from the second ground connection, and the biasing circuitry provides an on-state Vgsd to the fourth transistor switch to provide a shunt pathway from the second input/output terminal to the second ground connection.

28. A switch according to claim 27 the biasing circuitry is further for providing, when the high power switch is in a second high power switch state:
- on-state Vgsd at the on-state Vgsd level to the second transistor switch for biasing the second transistor switch in an on state;
- off-state Vgsd at the off-state Vgsd level to the first transistor switch for biasing the first transistor switch in an off state;
- on-state Vgsd at the on-state Vgsd level to the third transistor switch for biasing the third transistor switch to an on state; and
- off-state Vgsd at the off-state Vgsd level to the fourth transistor switch for biasing the fourth transistor switch in an off state, wherein when the high power switch is in a second high power switch state the biasing circuitry:
- provides on-state Vgsd to the second transistor switch to provide a shunt pathway between the first input/output terminal and the first ground connection;
- provides on-state Vgsd to the third transistor switch to provide a communication pathway between the second input/output terminal and the antenna;
- provides off-state Vgsd to the first transistor switch to isolate the antenna and the second input/output terminal from the first input/output terminal and the first ground connection; and
- provides off-state Vgsd to the fourth transistor switch to isolate the antenna and the second input/output switch from the second ground connection.

29. A high power switch comprising:
a first transistor switch;
a second transistor switch;
a first biasing controller for receiving a first control voltage and for:
- biasing at a gate of the first transistor switch at a fixed primary biasing fraction of the first control voltage; and
- biasing at a source-drain of the second transistor switch at a fixed secondary biasing fraction of the first control voltage, a second biasing controller for receiving a second control voltage and for:
- biasing at a source-drain of the first transistor switch at the fixed secondary biasing fraction of the second control voltage; and
- biasing at a gate of the second transistor switch at the fixed primary biasing fraction of the second control voltage input, wherein the first control voltage and the second control voltage are each a different one of a high system control voltage and a low system control voltage, and wherein:
- a magnitude of the difference between the product of the primary biasing fraction and the low system control voltage and the product of the secondary biasing fraction and the high system control voltage
- is less than
- a magnitude of the difference between the product of the primary biasing fraction and the high system control voltage and the product of the secondary biasing fraction and the low system control voltage
- by only an amount sufficient for at least one of:
  - bringing spurious harmonic emissions of said second transistor switch when biased to the off state below a pre-identified upper limit of acceptable spurious harmonic emissions from the second transistor switch in the off state; and
  - bringing a linearity of the high power switch above a pre-identified lower limit of acceptable linearity for the high power switch.

\* \* \* \* \*